United States Patent
Yao et al.

(10) Patent No.: US 10,996,634 B2
(45) Date of Patent: May 4, 2021

(54) SYSTEM AND METHOD FOR FAST-CONVERGING DIGITAL-TO-TIME CONVERTER (DTC) GAIN CALIBRATION FOR DTC-BASED ANALOG FRACTIONAL-N PHASE LOCK LOOP (PLL)

(71) Applicant: Samsung Electronics Co., Ltd., Gyeonggi-do (KR)

(72) Inventors: Chih-Wei Yao, Sunnyvale, CA (US); Ronghua Ni, San Jose, CA (US)

(73) Assignee: Samsung Electronics Co., Ltd.

(*) Notice: Subject to any disclaimer, the term of this patent is extended or adjusted under 35 U.S.C. 154(b) by 0 days.

(21) Appl. No.: 16/040,963

(22) Filed: Jul. 20, 2018

(65) Prior Publication Data

US 2019/0212703 A1 Jul. 11, 2019

Related U.S. Application Data

(60) Provisional application No. 62/613,898, filed on Jan. 5, 2018.

(51) Int. Cl.
| | |
|---|---|
| *G04F 10/00* | (2006.01) |
| *H03L 7/091* | (2006.01) |
| *H03M 1/12* | (2006.01) |
| *H03L 7/089* | (2006.01) |

(Continued)

(52) U.S. Cl.
CPC .......... *G04F 10/005* (2013.01); *H03L 7/0891* (2013.01); *H03L 7/091* (2013.01); *H03L 7/0991* (2013.01); *H03M 1/12* (2013.01); *H03M 1/48* (2013.01)

(58) Field of Classification Search
CPC .......... G04F 10/00; G04F 10/005; G06F 1/00; G06F 1/0328; G06F 7/00; G06F 7/68; H03B 28/00; H03K 4/00; H03K 4/026; H03L 7/00; H03L 7/0891; H03L 7/091;

(Continued)

(56) References Cited

U.S. PATENT DOCUMENTS

| | | |
|---|---|---|
| 5,319,320 A | 6/1994 | Abe et al. |
| 6,674,998 B2 | 1/2004 | Prentice |
| 7,042,972 B2 | 5/2006 | Fahim |

(Continued)

FOREIGN PATENT DOCUMENTS

CN 102006073 8/2012

OTHER PUBLICATIONS

Tasca et al., "A 2.9-to-4.0 GHz fractional-N digital PLL with bang-bang phase detector and 560 fsrms integrated jitter at 4.5 mW power," IEEE J. Solid-State Circuits, vol. 46, No. 12, pp. 2745-2758, Dec. 2011.

(Continued)

*Primary Examiner* — Lincoln D Donovan
*Assistant Examiner* — Dave Mattison
(74) *Attorney, Agent, or Firm* — The Farrell Law Firm, P.C.

(57) ABSTRACT

A system and method for fast converging gain calibration for phase lock loops (PLL) are herein disclosed. According to one embodiment, a method includes receiving, with a voltage generation circuit, an input value representing a difference between a sampled voltage and a reference voltage, and adjusting, with the voltage generation circuit, the reference voltage by generating a voltage output based on the difference represented by the input value.

24 Claims, 19 Drawing Sheets

(51) Int. Cl.
  *H03L 7/099* (2006.01)
  *H03M 1/48* (2006.01)
(58) Field of Classification Search
  CPC ......... H03L 7/0991; H03M 1/00; H03M 1/12;
            H04M 1/00; H04M 1/505
  USPC ....................................................... 327/107
  See application file for complete search history.

(56) References Cited

U.S. PATENT DOCUMENTS

| | | | |
|---|---|---|---|
| 7,683,683 B1* | 3/2010 | Majumder | ............ H03B 19/00 |
| | | | 327/122 |
| 8,564,342 B2 | 10/2013 | Yao | |
| 8,994,573 B2 | 3/2015 | Henzler et al. | |
| 9,588,497 B1* | 3/2017 | Monk | ................... G04F 10/005 |
| 9,608,641 B2 | 3/2017 | Van Den Heuvel | |
| 9,740,175 B2 | 8/2017 | Burg et al. | |
| 2012/0280731 A1* | 11/2012 | Rhee | ...................... H03L 7/087 |
| | | | 327/157 |
| 2013/0063191 A1* | 3/2013 | Patil | ..................... H03K 5/1565 |
| | | | 327/156 |
| 2017/0012638 A1* | 1/2017 | Furuta | ..................... H03M 1/46 |

OTHER PUBLICATIONS

Levantino et al., "An Adaptive Pre-Distortion Technique to Mitigate the DTC Nonlinearity in Digital PLLs," IEEE JSSC, vol. 49, No. 8, pp. 1762-1772, Aug. 2014.
Raczkowski et al., "A 9.2-12.7 GHz wideband fractional-N subsampling PLL in 28nm CMOS with 280fs RMS jitter," IEEE Radio Frequency Intergrated Circuits Symp., pp. 89-92, Jun. 2014.
Chang et al., "A Fractional-N Divider-Less Phase-Locked Loop with a Subsampling Phase Detector," IEEE J. Solid-State Circuits, vol. 49, No. 12, pp. 2964-2975, Dec. 2014.
Gao et al., "A 2.7-to-4.3 GHz, 0.16psrms jitter, -246.8dB FOM digital fractional-N sampling PLL in 28nm CMOS," ISSCC Dig. Tech Papers, pp. 174-175, Feb. 2016.

* cited by examiner

SYSTEM AND METHOD FOR FAST-CONVERGING DIGITAL-TO-TIME CONVERTER (DTC) GAIN CALIBRATION FOR DTC-BASED ANALOG FRACTIONAL-N PHASE LOCK LOOP (PLL)

PRIORITY

This application claims priority under 35 U.S.C. § 119(e) to a U.S. Provisional Patent Application filed on Jan. 5, 2018 in the United States Patent and Trademark Office and assigned Ser. No. 62/613,898, the entire contents of which are incorporated herein by reference.

FIELD

The present disclosure relates generally to an electronic circuit, and more particularly, to a system and method for fast-converging digital-to-time converter (DTC) gain calibration for a DTC-based analog fractional-N phase lock loop (PLL).

BACKGROUND

Digital-to-time converter (DTC) based fractional-N phase lock loops (PLL) have demonstrated low power consumption, low phase noise and good figures-of-merit compared to other fractional-N PLL architectures. DTC-based fractional-N PLLs can be realized in both digital PLL form and analog PLL form.

Both the digital and analog forms of DTC-based fractional-N PLLs require DTC gain calibration to identify the average resolution of the DTC. DTC gain calibration should be performed in the background while a PLL is running, as a fixed DTC gain value cannot be specified due to voltage and temperature variations as well as random mismatches. Without an accurate estimation of the DTC gain, a DTC-based fractional-N PLL would suffer from worse phase noise and worse fractional spurs.

SUMMARY

According to one embodiment, a method is provided. A method includes receiving, with a voltage generation circuit, an input value representing a difference between a sampled voltage and a reference voltage, and adjusting, with the voltage generation circuit, the reference voltage by generating a voltage output based on the difference represented by the input value.

According to one embodiment, an electronic circuit is provided. The electronic circuit includes a voltage generation circuit configured to receive an input value representing a difference between a sampled voltage and a reference voltage, and adjust the reference voltage by generating a voltage output based on the difference represented by the input value.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION OF EMBODIMENTS OF THE PRESENT DISCLOSURE

Figure 1:
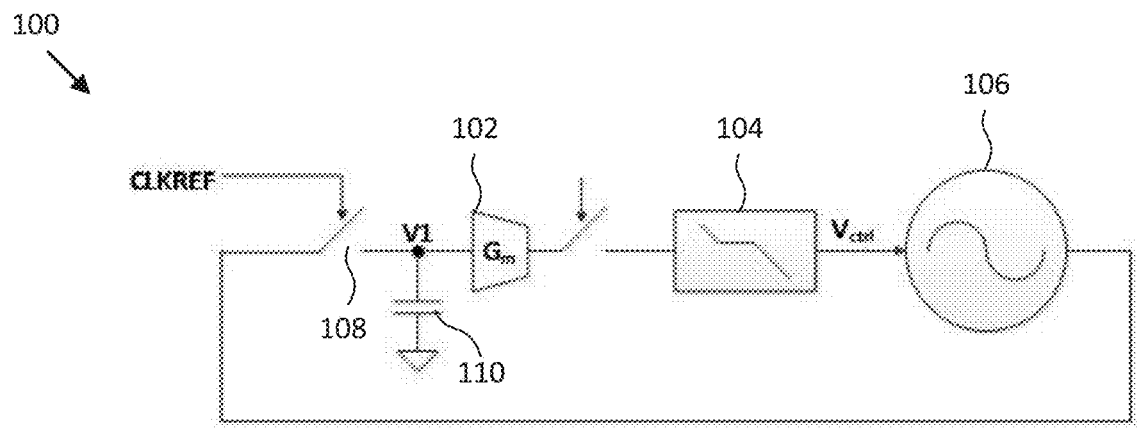
FIG. 1 is a diagram of an integer-N sub-sampling PLL, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

Digital-to-time converter (DTC) based fractional-N phase lock loops (PLLs) may be implemented in digital form and in analog form. In the digital form, a digitally controlled oscillator (DCO) is used. As a result, phase error information is quantized to a digital word using a one-bit analog-to-digital converter (ADC) (e.g., a flip-flop) or a multi-bit ADC. The phase error is quantized to a digital form that drives a digital loop-filter and a digital DTC calibration loop. The PLL enforces a zero-average phase error when the loop is locked. The zero-average value from a digital phase detector also ensures robustness of the DTC calibration algorithm.

In the analog form, a voltage-controlled oscillator (VCO) may be used, and the sampled voltage representing the phase error drives an analog loop filter through a Gm (voltage-to-current) circuit. The one bit phase error polarity for the DTC calibration circuit may be generated by a comparator. When the PLL enters phase lock, a sampled voltage value at the Gm circuit would generate a zero average current through the Gm circuit. Due to the difference between threshold voltage of the comparator and the sampled voltage value at the Gm circuit, the phase polarity input to the DTC calibration circuit does not have a zero average value because it would be overwhelmed by the threshold voltage difference. Such an input pattern to a DTC calibration circuit lacks useful information for DTC gain tracking, therefore compromising the robustness of the DTC background calibration. When the difference between the comparator threshold voltage and the Gm voltage is large, the estimated DTC gain deviates from the correct value, causing phase noise and spur degradation.

Figure 2:
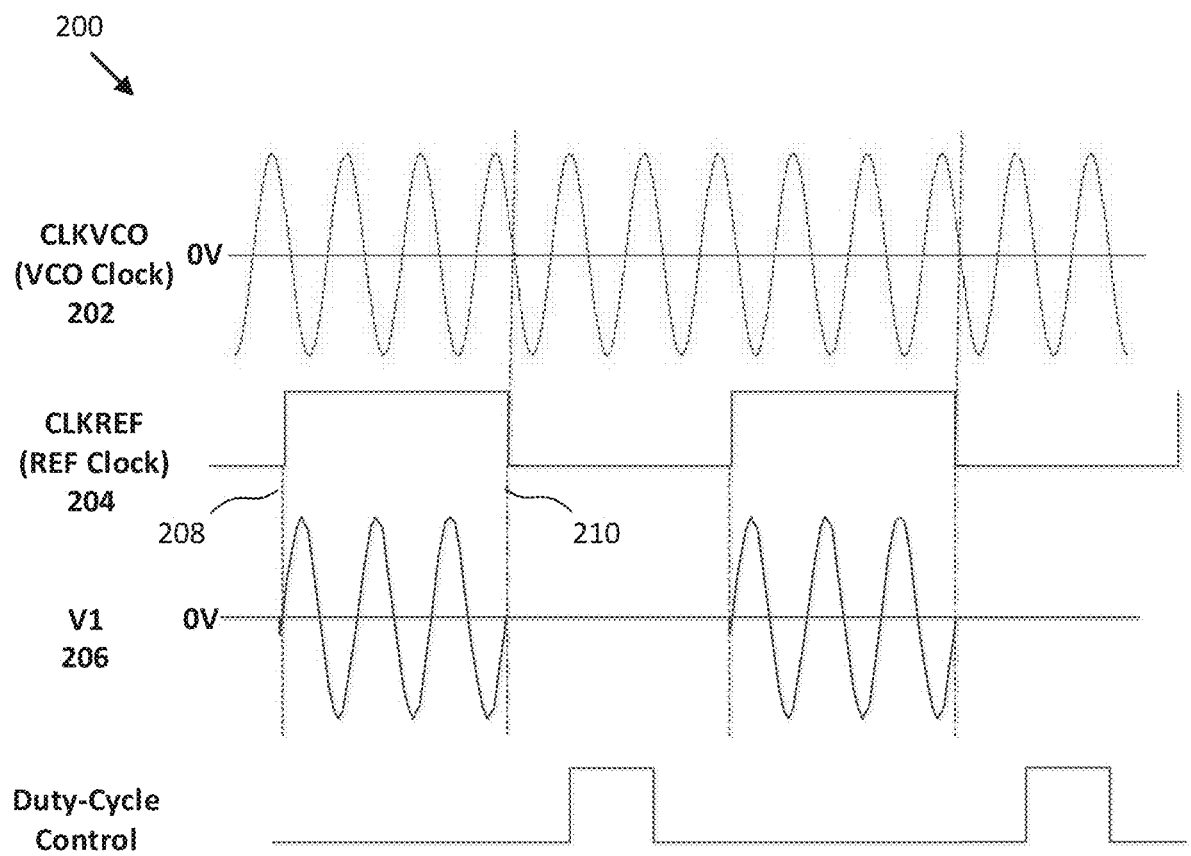
FIG. 2 is a graph for tracking the operation of the PLL, according to an embodiment.

FIG. 1 is a diagram of an integer-N sub-sampling PLL 100, according to an embodiment. FIG. 2 is a graph 200 for tracking the operation of the PLL 100, according to an embodiment. The PLL 100 includes a Gm circuit 102 that converts the input voltage to current, an analog loop filter 104 for filtering the signal received from the Gm circuit 102, and a VCO 106 for producing a frequency, as well as a sampling switch 108 and sampling capacitor 110, which may be used to sample the voltage V1 and operate as a sampling phase detector (SPD). The graph 200 tracks the CLKVCO waveform 202, the CLKREF waveform 204, and the V1 voltage 206.

Referring to FIGS. 1 and 2, at the rising edge 208 of CLKREF 202, the sampling switch 108 closes and the V1 node voltage 206 tracks the VCO 106 waveform 202. At the falling edge 210 of CLKREF 202, the VCO voltage is sampled to the capacitor 110 at node V1. A slight phase shift in the VCO 106 oscillation waveform results in non-zero values sampled to node V1 that are proportional to the amount of phase error to the first order. Therefore, the sampling switch 108 and the sampling capacitor 110 together form a sampling phase detector, and it works well when the VCO frequency is close to N*fref (N being a positive non-zero integer and fref being the reference clock frequency). The Gm circuit 102 converts the voltage value at node V1 to current to drive the analog loop-filter. A sub-sampling PLL can lock to any harmonics of CLKREF, and therefore, a frequency-locked loop is required to ensure locking to the correct harmonic is achieved.

Figure 3:
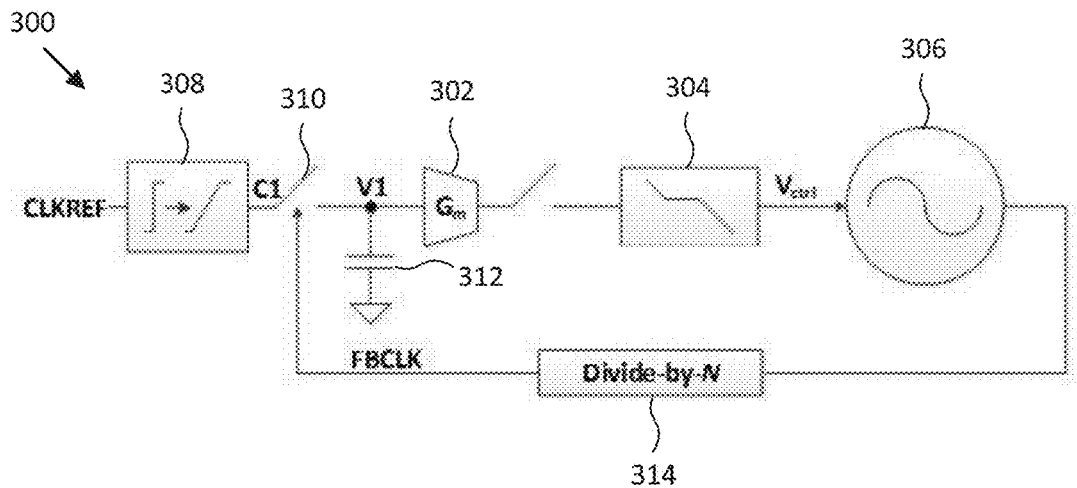
FIG. 3 is a diagram of an analog integer-N sampling PLL, according to an embodiment
Figure 4:
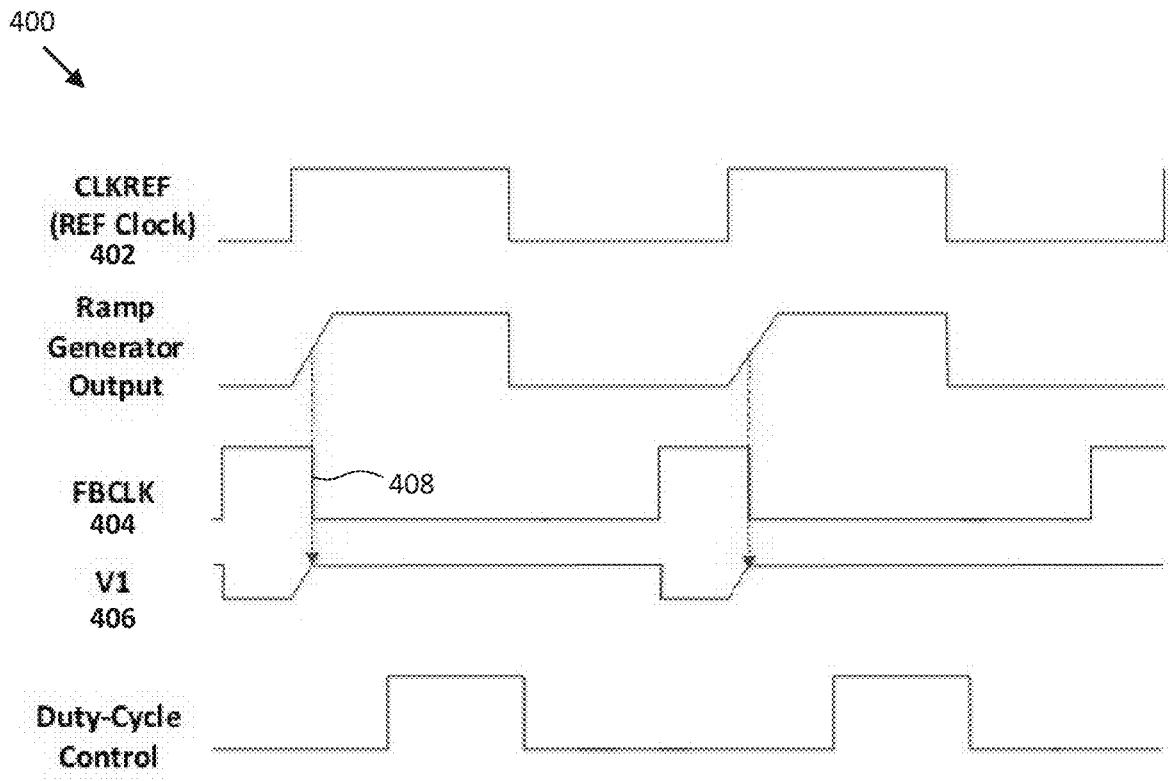
FIG. 4 is a graph for tracking the operation of the PLL, according to an embodiment.

FIG. 3 is a diagram of an analog integer-N sampling PLL 300, according to an embodiment. FIG. 4 is a graph 400 for tracking the operation of the PLL 300, according to an embodiment. The PLL 300 includes a Gm circuit 302, an analog loop filter 304, a VCO 306, a ramp generator 308, a sampling switch 310, a sampling capacitor 312, and a feedback divider 314. The graph 400 tracks the CLKREF waveform 402, FBCLK 404 and the V1 voltage 406.

Referring to FIGS. 3 and 4, the feedback divider 314 with a fixed division ratio is introduced. The reference clock CLKREF feeds the ramp generator 308, which generates a version of the CLKREF waveform 402 at node C1 with a well-defined rise time. At the falling edge 408 of the feedback clock FBCLK 404, the voltage at node C1 is sampled to node V1 406. The sampled voltage value carries the phase information of the VCO 306 relative to the reference clock CLKREF. For a fractional-N PLL, the ratio of the output frequency to the reference clock frequency fref is a rational number that may be expressed as $K/2^M$, where K and M are positive integer values. Both an analog sub-sampling PLL and an analog sampling PLL may be extended to support fractional-N frequency synthesis through utilization of a DTC.

Figure 5:
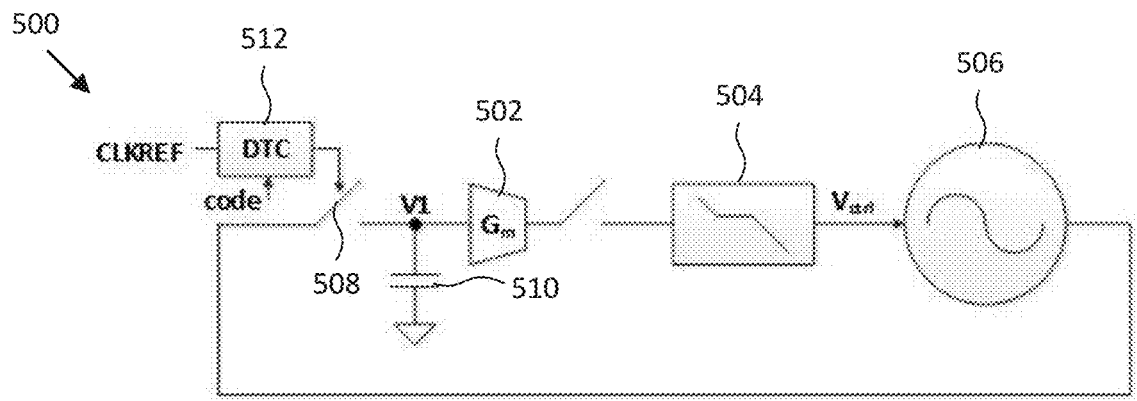
FIG. 5 is a diagram of a DTC-based analog subsampling fractional-N PLL, according to an embodiment.
Figure 6:
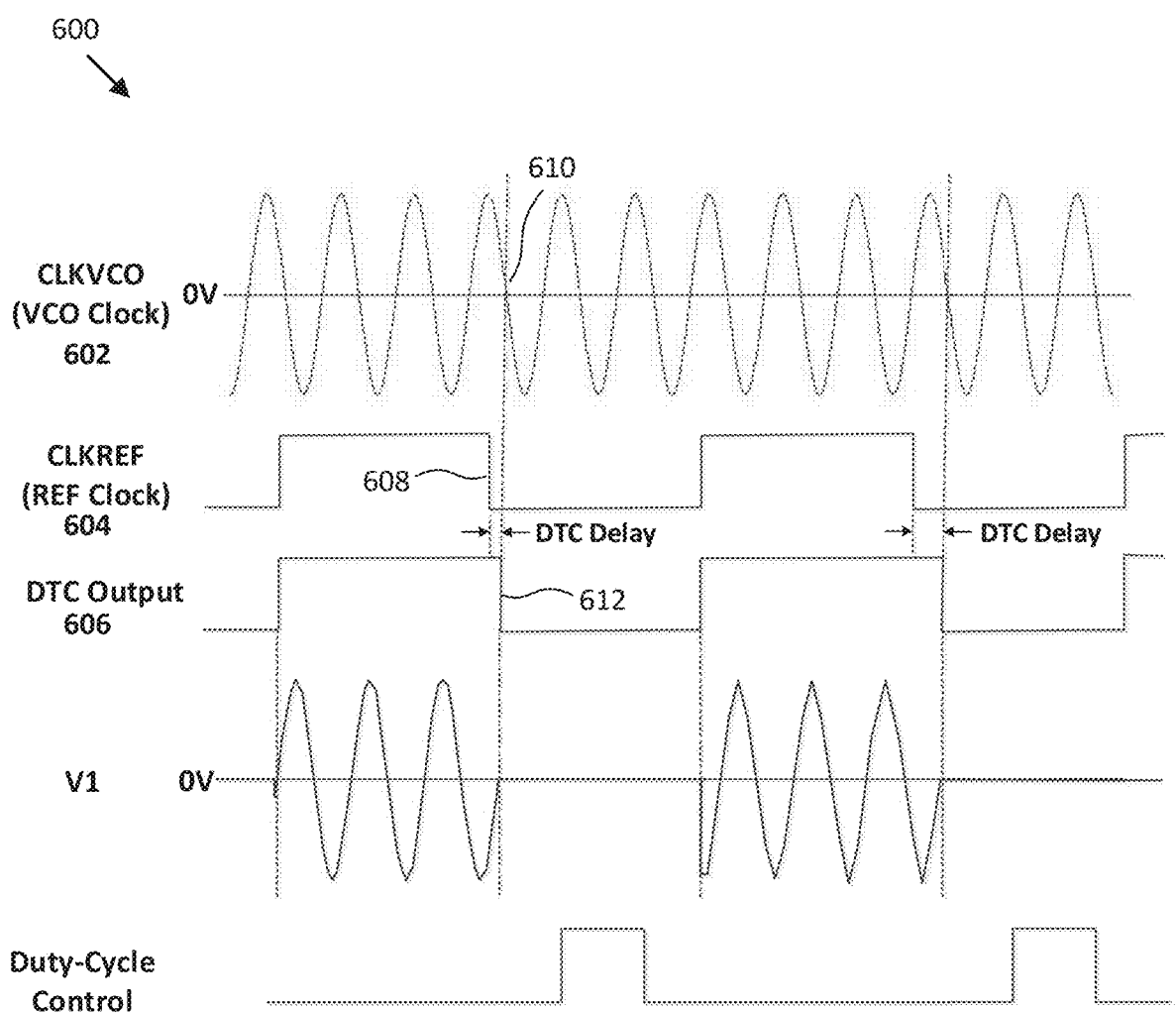
FIG. 6 is a graph for tracking the operation of the PLL, according to an embodiment.

FIG. 5 is a diagram of a DTC-based analog subsampling fractional-N PLL 500, according to an embodiment. FIG. 6 is a graph 600 for tracking the operation of the PLL 500, according to an embodiment. The PLL 500 includes a Gm circuit 502, an analog loop filter 504, a VCO 506, a sampling switch 508, a sampling capacitor 510, and a DTC 512. The graph 600 tracks the CLKVCO waveform 602, the CLKREF waveform 604, and the DTC output waveform 606.

Referring to FIGS. 5 and 6, due to the fractional-N frequency ratio, the falling edges (e.g., at 608) of CLKREF 604 are not naturally aligned to falling edges (e.g., at 610) of the VCO clock 602 when loop is locked. In order to detect phase error carried by the falling edge 610 of the VCO clock, the DTC 512 may be provided for applying a sufficient delay to have the falling edge 612 of DTC output clock 606 aligned to the falling edges 610 of the VCO clock 602. A DTC 512 requires a digital delay code, which may be generated from the expected phase error scaled by the estimated DTC gain.

Figure 7:
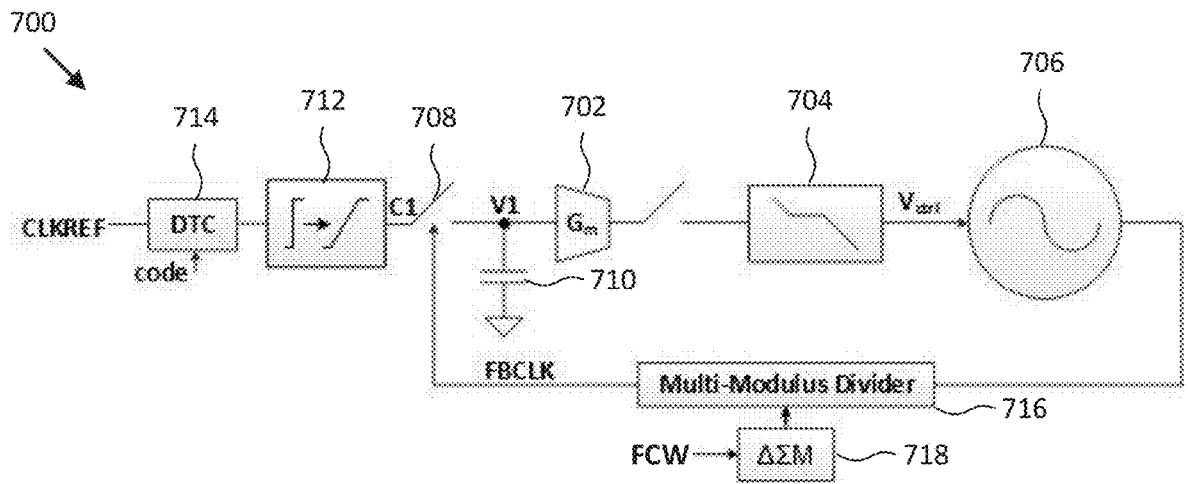
FIG. 7 is a diagram of a DTC-based analog sampling fractional-N PLL, according to an embodiment.
Figure 8:
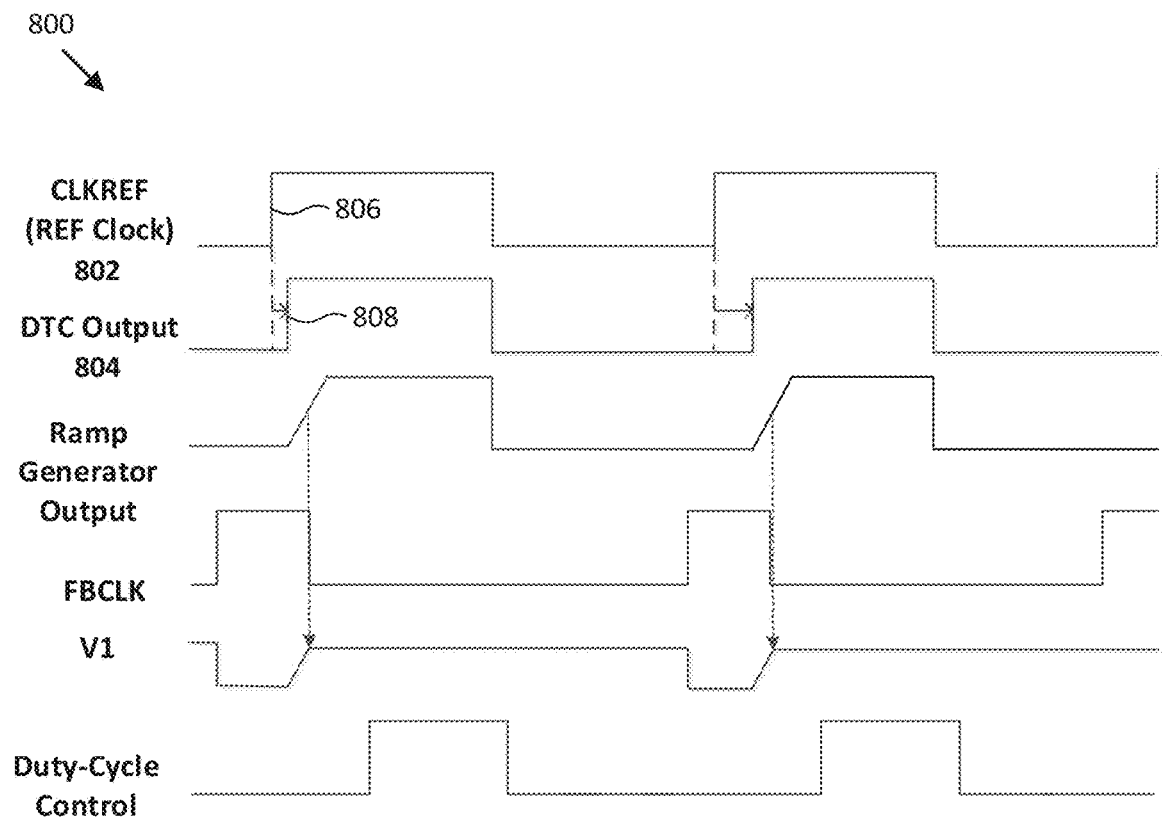
FIG. 8 is a graph for tracking the operation of the PLL, according to an embodiment.

FIG. 7 is a diagram of a DTC-based analog sampling fractional-N PLL 700, according to an embodiment. FIG. 8 is a graph 800 for tracking the operation of the PLL 700, according to an embodiment. The PLL 700 includes a Gm circuit 702, an analog loop filter 704, a VCO 706, a sampling switch 708, a sampling capacitor 710, a ramp generator 712, a DTC 714, a feedback divider (multi-modulus divider) 716, and a delta-sigma modulator (ΔΣ modulator) 718. The graph 800 tracks the CLKREF waveform 802 and the DTC output waveform 804.

Referring to FIGS. 7 and 8, the DTC 714 is added before the ramp generator 712 to delay the rising edge 806 of CLKREF 802 to the rising edge 808 shown in the DTC waveform 804. With the proper amount of delay introduced by the DTC 714, the quantization error introduced by the feedback divider 716 and the ΔΣ modulator 718 may be canceled out. Thus, the sampled voltage value at node V1 represents the phase error. For both the DTC-based subsampling fractional-N PLL 500 and the DTC-based sampling fractional-N PLL 700, generation of a digital DTC code may be utilized.

Figure 9:
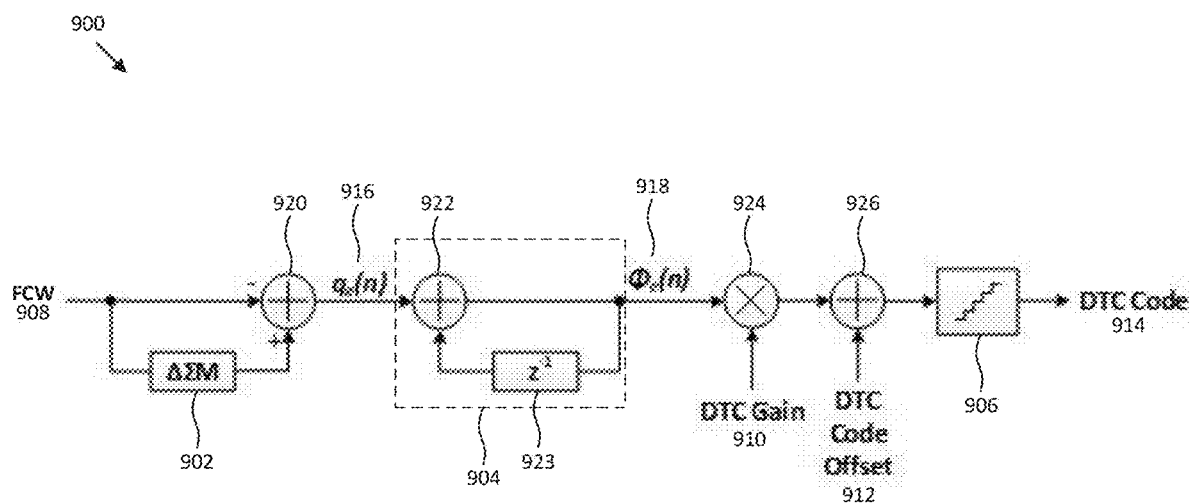
FIG. 9 is a diagram of a DTC code generation circuit, according to an embodiment.

FIG. 9 is a diagram of a DTC code generation circuit 900, according to an embodiment. The DTC control word generation circuit 900 includes a sigma-delta modulator (ΣΔ-modulator) 902, a digital integrator 904 and a quantizer 906. The time delay of the DTC is controlled by a DTC code word 914 generated by the DTC control word generation circuit 900. A FCW 908 may be input into the generation circuit 900 and may specify the desired frequency synthesis ratio. A ΣΔ-modulator 902 may generate a digital sequence with a time-averaged ratio that is identical to the FCW 908. The frequency quantization error sequence qe(n) 916 (generated through accumulator 920) is the difference between the ΣΔ-modulator 902 output and the FCW 908. To translate from a frequency quantization error sequence 916 to a phase error sequence $\varphi_e(n)$ 918, a digital integrator 904 (including accumulator 922 and 923) may be employed and the phase error sequence 918 may be generated. For proper cancellation, the expected phase error 918 may be scaled by the DTC gain 910 via a mixer 924. A DTC code offset 912 is added via accumulator 926 to shift the DTC code 914 to meet the DTC input range requirement. The extra delay introduced due to the addition of the DTC code offset 912 is equivalent to a fixed delay introduced to CLKREF, and it does not affect PLL operation.

Figure 10:
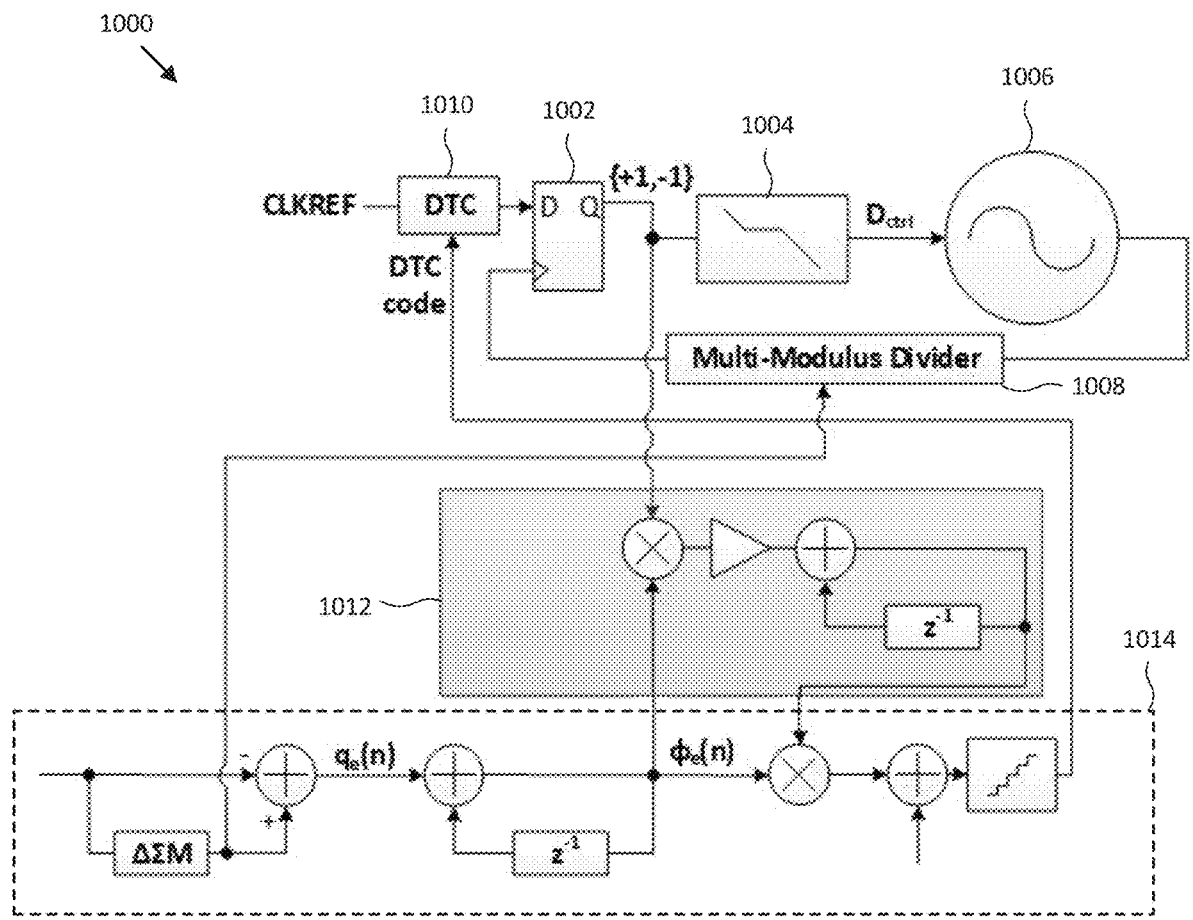
FIG. 10 is a diagram of a DTC calibration system for a digital PLL with a 1-bit sampling phase detector, according to an embodiment.

FIG. 10 is a diagram of a DTC calibration system 1000 for a digital PLL with a 1-bit sampling phase detector, according to an embodiment. The DTC calibration system 1000 includes a digital flip-flop 1002, a digital loop filter 1004, a digitally controlled oscillator (DCO) 1006, a feedback divider 1008, a DTC 1010, a DTC gain calibration circuit 1012, and a DTC code word generation circuit 1014. The DTC output is sampled at the rising edge of the feedback clock by the digital flip-flop 1002. The flip-flop 1002 outputs values of either 1 or 0. However, when serving as a 1-bit digital phase detector, the output value of the flip-flop 1002 may be interpreted as value +1 and −1. This 1-bit phase detector output drives the digital loop filter 1004 and the DTC gain background calibration circuit 1012. When the loop is locked, the digital PLL 1000 forces the average of output values of 1-bit phase detector to be zero. A zero average input to the DTC gain calibration circuit 1012 may also ensure fast and accurate DTC calibration.

Figure 11:
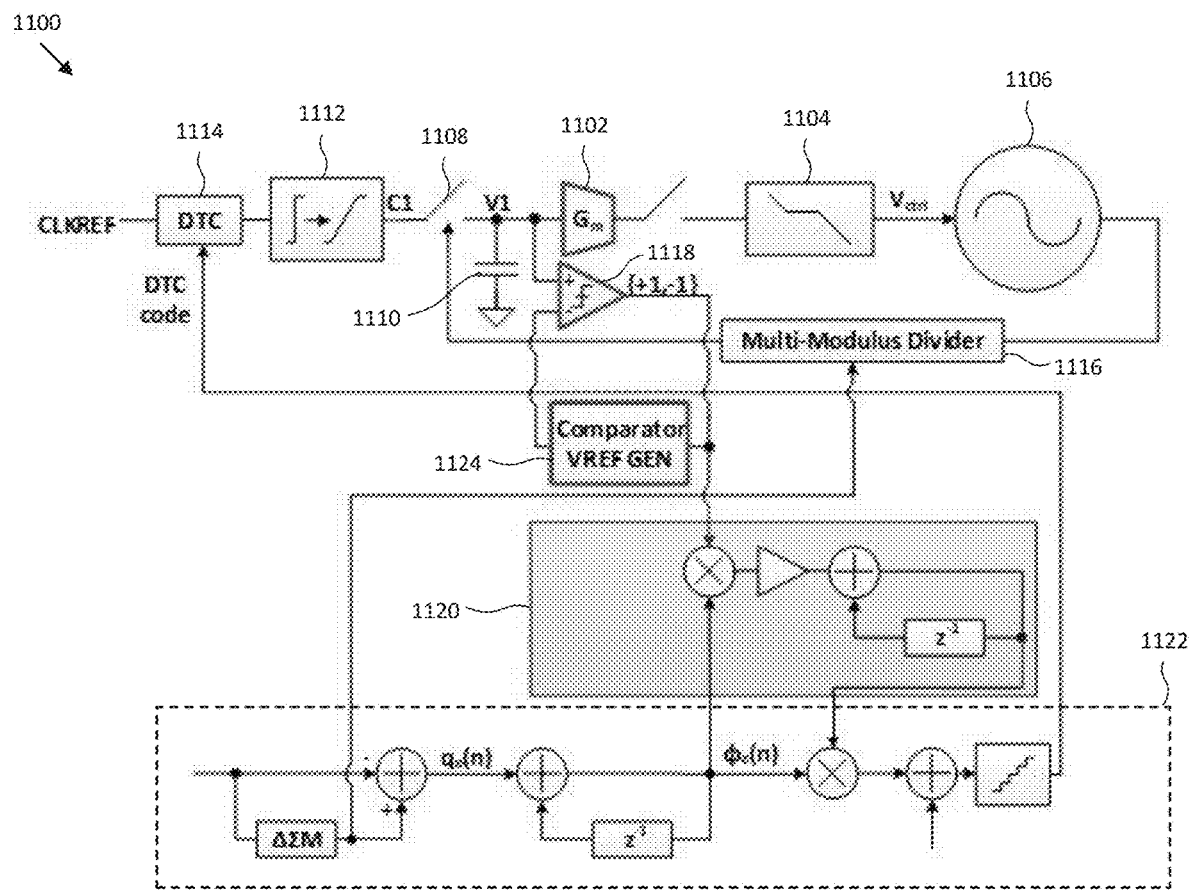
FIG. 11 is a diagram of an electronic circuit, according to an embodiment.

FIG. 11 is a diagram of an electronic circuit 1100, according to an embodiment. The electronic circuit 1100 includes a Gm circuit 1102, an analog loop filter 1104, a VCO 1106, a sampling switch 1108, a sampling capacitor 1110, a ramp generator 1112, a DTC 1114, a feedback divider 1116, a comparator 1118, a DTC gain calibration circuit 1120, a DTC code word generation circuit 1122, and a voltage generation circuit 1124. In a DTC-based analog subsampling fractional-N PLL (or a DTC-based sampling fractional-N PLL), the input to the analog loop-filter 1104 and the input to the DTC gain calibration circuit 1120 are generated by different circuits. The sampling phase detector (e.g., the sampling switch 1108 and the sampling capacitor 1110) output drives the Gm circuit 1102 to deliver a current to the analog loop-filter 1104. However, the input to the DTC gain calibration circuit 1120 comes from a comparator 1118. The voltage mismatch between the Gm circuit 1102 and the comparator 1118 for the DTC gain calibration circuit 1120 causes DTC gain convergence difficulty and results in performance degradation. The PLL may be configured to dynamically adjust the comparator 1118 threshold (e.g., reference voltage input) with the voltage generation circuit 1124 to track the threshold voltage of the Gm circuit 1102.

The circuit 1100 may include a DTC 1114 that delays either a reference clock or a feedback clock to remove quantization noise for fractional-N mode frequency synthesis, a VCO 1106 that generates the output clock of the frequency synthesizer, a SPD (e.g., the sampling switch 1108 and the sampling capacitor 1110) that extracts timing difference between the DTC output and the reference clock or feedback clock, a comparator 1118 that converts the analog SPD output to 1-bit output for DTC gain calibration, and a digital circuit 1120 to perform DTC gain calibration.

The circuit 1100 also includes a voltage generation circuit 1124 (also referred to as "voltage generator") that dynamically adjusts the comparator 1118 threshold voltage based on an output representing the difference between the sampled Gm 1102 voltage and the comparator 1118 input reference voltage. The voltage generation circuit 1124 may be referred to as a reference voltage (VREF) generation circuit for ease of description. Instead of relying on a pre-defined comparator threshold, the comparator 1118 threshold voltage can be dynamically adjusted to track the Gm circuit 1102 threshold voltage. The VREF generation circuit 1124 may program (e.g., output) a reference voltage to the comparator 1118 to cause the comparator 1118 reference voltage to approach the Gm voltage, approaching the Gm voltage until converged (e.g., the value of the reference voltage matching the value of the Gm voltage), such that the comparator 1118 would have a zero average value output. Thus, when the PLL is locked and the convergence occurs, the comparator 1118 may have the same threshold voltage as the Gm circuit 1102. This improves convergence issues and performance degradation issues of a DTC-based analog fractional-N PLL.

Figure 12:
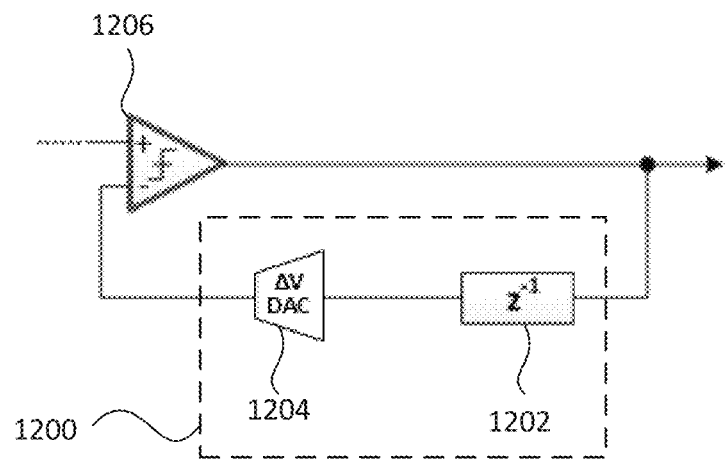
FIG. 12 is a diagram of a VREF generation circuit, according to an embodiment.

FIG. 12 is a diagram of a VREF generation circuit 1200, according to an embodiment. The VREF generation circuit 1200 may include a 1-bit digital delay cell 1202, which may be implemented as a flip-flop, and a step-voltage digital-to-analog converter (ΔV-DAC) 1204. In some embodiments, the digital delay cell 1202 may be omitted and the input and output of the ΔV-DAC 1204 may be shorted. The input of the VREF generation circuit 1200 may be a value output from a comparator 1206, and the output of the VREF generation circuit 1200 may be a reference voltage input to the comparator 1206. The ΔV-DAC 1204 may increment the value of the reference voltage according to an output from the comparator 1206. For example, if the input is +1, the ΔV-DAC 1204 increases the output voltage by ΔV. If the input is −1, the ΔV-DAC 1204 decreases the output voltage by ΔV. The ΔV DAC 1204 implementation is significantly simpler than a conventional DAC, and it minimizes the area overhead and design effort. A step-size ΔV may be about 0.1 mV. Since digital filtering is not required, the toggling of comparator output due to noise is directly transferred to the ΔV-DAC 1204. Lower values of ΔV may be used to reduce system performance degradation from VREF variations due to random toggling caused by noise. The step-size of the ΔV-DAC 1204 may be configured to adjust during phase lock and adjustment based on a number of consecutive +1's or −1's output from the comparator 1206.

Figure 13:
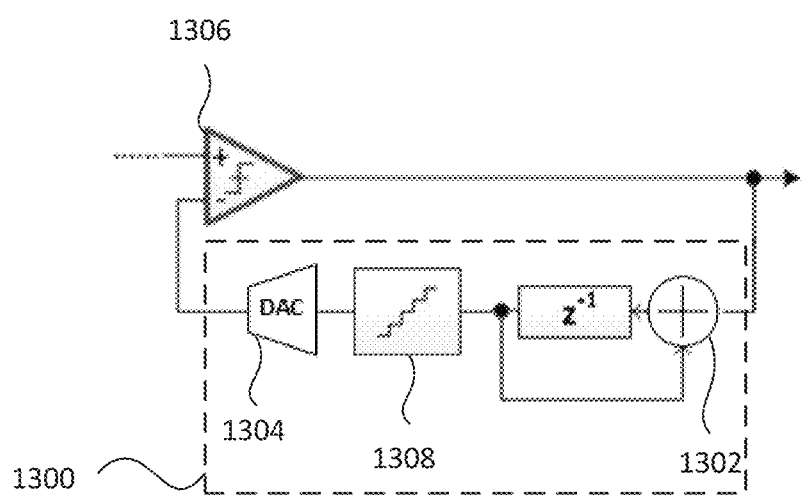
FIG. 13 is a diagram of a VREF generation circuit, according to an embodiment.

FIG. 13 is a diagram of a VREF generation circuit 1300, according to an embodiment. The VREF generation circuit 1300 may include a digital accumulator 1302 and a DAC 1304. The input of the VREF generation circuit 1300 may be a value output from a comparator 1306, and the output of the VREF generation circuit 1300 may be a reference voltage input to the comparator 1306. The digital accumulator 1302 is in a negative feedback-loop and may effectively operate a low-pass filter, and the comparator 1306 output toggling due to noise is filtered by the digital low-pass filter. As a result, the resolution of the DAC 1304 can be relaxed (e.g., about 2 mV to about 4 mV). The digital accumulator 1302 has more bits than the DAC 1304 input, and a quantizer 1308 may be employed to generate the DAC code.

Figure 14:
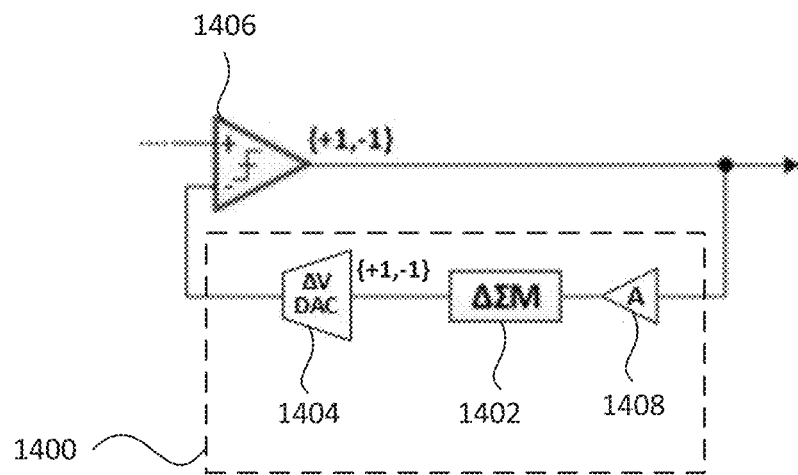
FIG. 14 is a diagram of a VREF generation circuit, according to an embodiment.

FIG. 14 is a diagram of a VREF generation circuit 1400, according to an embodiment. The VREF generation circuit 1400 may include a ΔΣ modulator 1402 and a ΔV DAC 1404. The input of the VREF generation circuit 1400 may be a value output from a comparator 1406, and the output of the VREF generation circuit 1400 may be a reference voltage input to the comparator 1406. A scaling factor 'A' 1408 less than 1 may be implemented scales the input to the ΔΣ modulator 1402. A first-order ΔΣ modulator may be utilized, although it is contemplated that higher order ΔΣ modulators may be implemented. The resolution of the ΔV DAC 1404 may be relaxed (e.g., about 2 mV to about 4 mV) due to the introduction of a ΔΣ modulator 1402.

Figure 15:
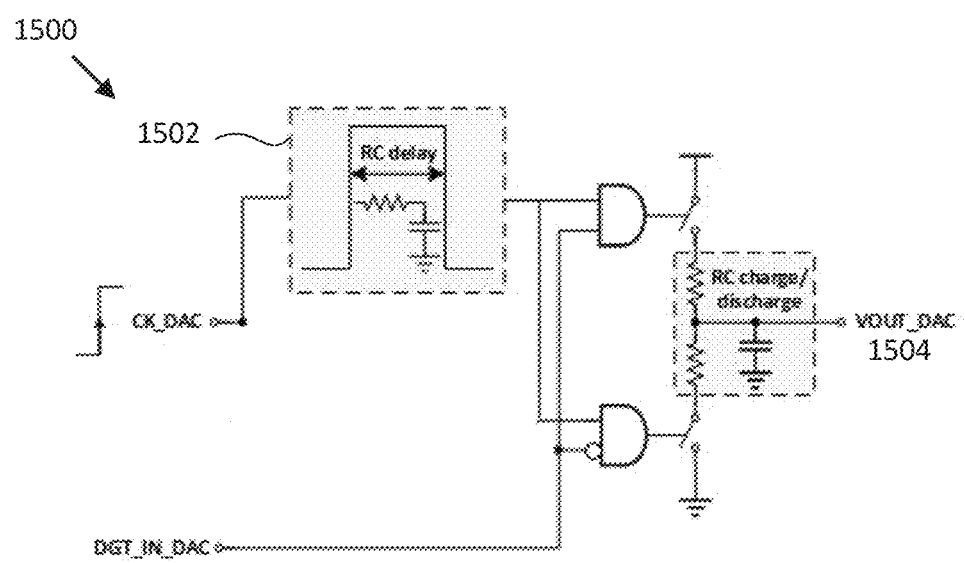
FIG. 15 is a diagram of a ΔV-DAC circuit, according to an embodiment.

FIG. 15 is a diagram of a ΔV-DAC circuit 1500, according to an embodiment. The ΔV DAC circuit 1500 includes a reset delay 1502, and may include multiple modes, such as a reset mode and a charge/discharge mode. During reset mode, the DAC output 1504 may be precharged to half VDD via resistor division, and it may discharge/charge by one step every clock cycle based on the 1-bit signed input from the ΔΣ modulator (e.g., "+1" represents charging and "−1" represents discharging). The voltage step size may be determined by the pulse width (i.e., resistor capacitance (RC) delay), which may have a relaxed accuracy requirement (e.g., about 2 mV to about 4 mV) depending on the VREF generation circuit implementation. The ΔV DAC circuit 1500 is significantly simpler than a typical DAC, which minimizes area overhead and design effort.

Figure 16:
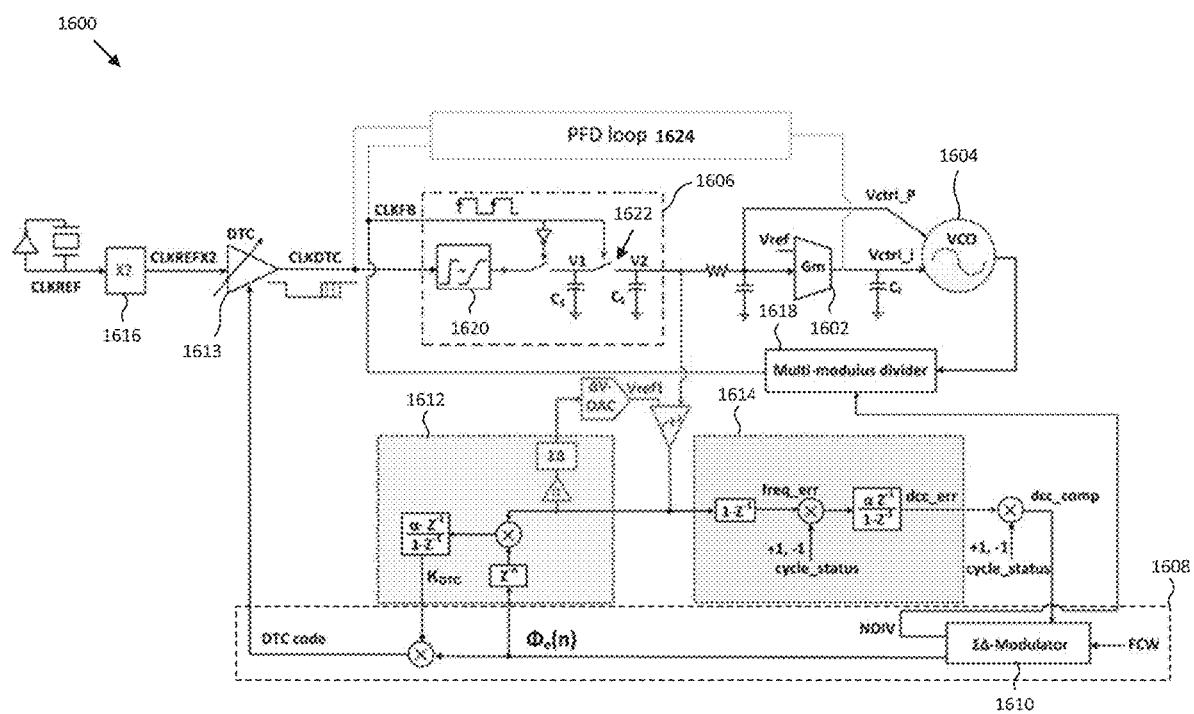
FIG. 16 is a diagram of an electronic circuit with a reference doubler, according to an embodiment.

FIG. 16 is a diagram of a DTC-based fractional-N analog PLL 1600 with a reference doubler, according to an embodiment. The DTC-based fractional-N analog PLL 1600 includes a Gm circuit 1602, a VCO 1604, an SPD 1606, a DTC code word generator 1608, a ΣΔ-modulator 1610, a DTC gain calibration circuit 1612, a DTC 1613, a duty cycle calibration circuit 1614, a reference clock doubler 1616, and a multi-modulus divider 1618 modulated by the ΣΔ-modulator 1610 that is used in the feedback path for fractional-N generation. The QN of the ΣΔ-modulator 1610 is scaled by the DTC gain ($K_{DTC}$) and then modulates the DTC 1613 in the reference path to cancel the QN in CLKFB. The clock doubler 1616 doubles the PLL sampling rate to further reduce the in-band PN. The reference clock duty cycle error is corrected prior to the SPD 1606 by adjusting the phase of the CLKFB accordingly to match the even/odd mismatch in CLKREFX2. As a result, the SPD 1606 only sees small phase error when locked, similar to the integer-N case.

The SPD 1606 includes a slope generator 1620 and a two-stage sampler 1622. The rising edge of CLKDTC triggers a well-defined voltage ramp with high dV/dt slope, and is sampled by CLKFB, converting the phase error into a sampled voltage. Besides the sample-and-hold operation, the two-stage sampler 1622 also provides a $1^{st}$-order discrete time IIR low-pass filtering on the phase error. The sampled voltage is then split into two paths: one path directly tunes the VCO 1604 ($V_{ctrl\_P}$) providing proportional gain ($K_{vco\_P}$), and the other path goes through a $G_M$ circuit 1602 and integration capacitor $C_I$ to generate the $V_{ctrl\_I}$ for VCO

1604. This PI configuration is a natural choice for a sampling PLL. It eliminates the noisy resistor in a conventional analog loop filter. The PLL loop bandwidth is mainly determined by the dV/dt slope and the VCO tuning sensitivity, $K_{vco\_P}$, and is insensitive to $G_M$ and $C_I$. This reduces the loop gain variation over PVT, and also relaxes the gain accuracy requirement on the $G_M$ circuit 1602. A phase frequency detector (PFD) loop 1624 is used to speed up initial frequency/phase acquisition, which is powered down after frequency locking to save power. Without VREF adjustment as described above, the threshold voltage mismatch causes the comparator to output little useful information to support DTC calibration.

Simulations were run concerning DTC gain values at threshold mismatch values of a 0 mV, 20 mV, and 100 mV, 0 mV, and 0 mV at ¼ calibration bandwidth with a correct gain value of 250.

With a 20 mV and a 100 mV threshold mismatch, the comparator output is mostly one, and it lacks useful information for DTC calibration. Due to a large 100 mV difference between the threshold voltages, the DTC gain calibration result would deviate from the correct value, and it would translate to worse phase noise and spur performance. The DTC gain waveform appears to be less noisy for the 20 mV mismatch case comparing to the 0 mV mismatch case. However, this is due to the calibration slow-down because the comparator output overwhelmed by the threshold mismatch contains little information for DTC gain calibration. The 0 mV threshold voltage with ¼ calibration bandwidth has the cleanest DTC gain waveform as expected.

As described herein, the dynamic VREF generation circuit allows the comparator to track the threshold voltage of the Gm circuit. The input to the DTC-gain calibration circuit from the comparator has about a zero average value and the DTC gain waveform is similar to the case where the voltage at the Gm circuit and the comparator threshold voltage matched.

Figure 17:
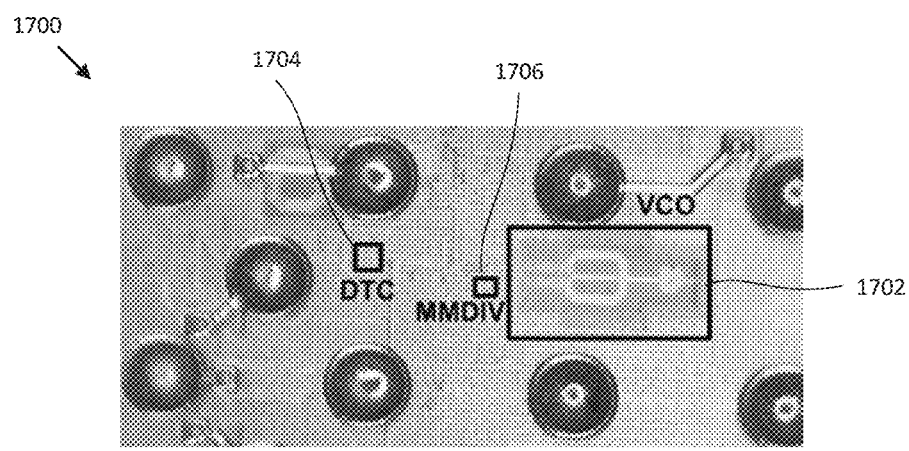
FIG. 17 is a diagram of a chip micrograph having various blocks in a PLL, according to an embodiment.

FIG. 17 is a diagram of a chip micrograph 1700 having various blocks in a PLL, according to an embodiment. The chip 1700 includes a VCO 1702, a DTC 1704, and a multi-modulus feedback divider (MMDIV) 1706. The 6-GHz VCO 2002 may be a thick-oxide complementary metal-oxide-semiconductor (CMOS) cross-coupled core with tail inductor degeneration to suppress the flicker noise up conversion. CMOS topology reuses the biasing current and also eases the biasing of accumulation mode varactors. Switched metal-oxide-metal (MoM) capacitors are used for coarse tuning. Two varactor arrays with different tuning sensitivity $K_{vco\_P}$ and $K_{vco\_I}$ are controlled by the loop for proportional and integral tuning path, respectively. The simulated VCO PN at 6 GHz may be −125dBc/Hz at 1-MHz offset to meet the stringent 5G cellular requirement.

Although the description above relates to a DTC gain calibration system, the present disclosure, including the above VREF generation circuits, may be applied in charge pump PLL designs, and other types of PLL designs without deviating from the scope of the present disclosure.

A DTC may be utilized to effectively cancel out quantization noise due to a ΣΔ-modulator for a fractional-N charge-pump PLL. Without a DTC, increasing the loop-filter bandwidth of a fractional-N charge-pump PLL would also increase the ΣΔ-modulator quantization noise at the PLL output. Wider loop-filter bandwidth is desirable for a low-power VCO or a ring-oscillator VCO to reduce the output clock root mean square (RMS) jitter or integrated phase noise.

Figure 18:
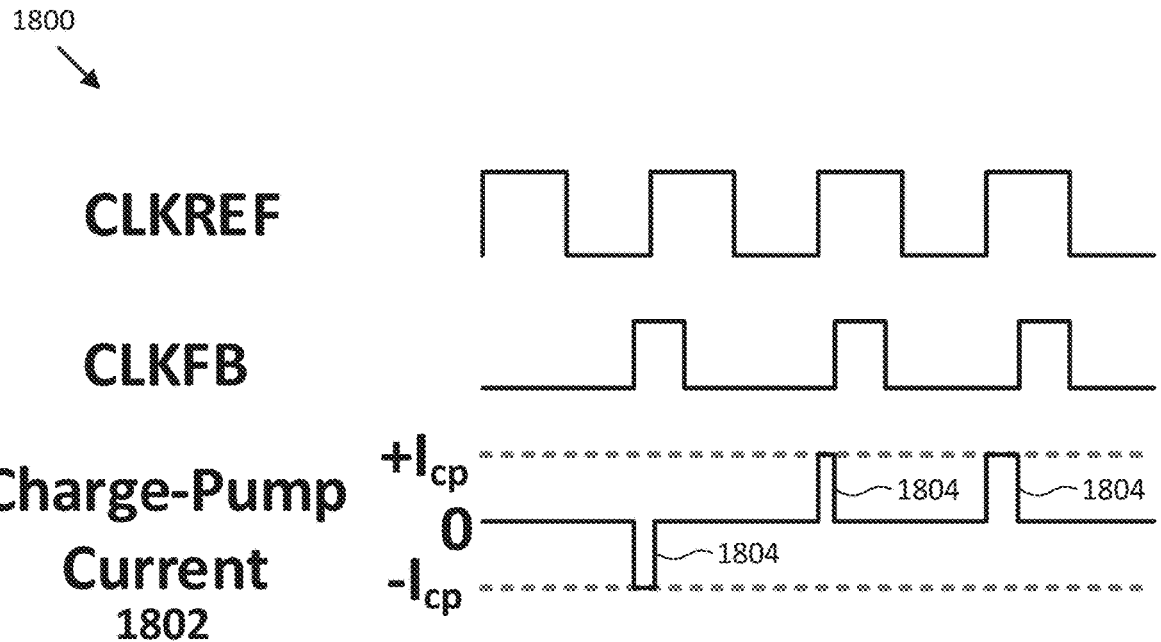
FIG. 18 is a graph tracking performance of a fractional-N charge-pump PLL without a DTC.
Figure 19:
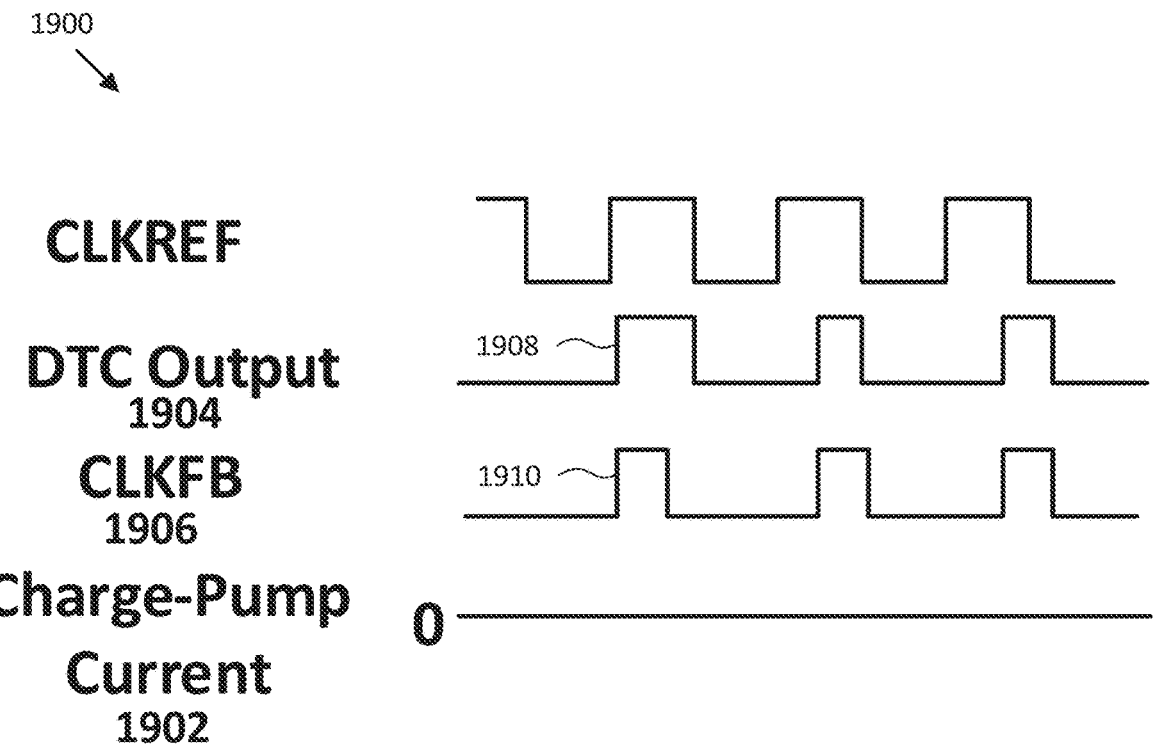
FIG. 19 is a graph tracking performance of a fractional-N charge-pump PLL with a DTC, according to an embodiment.

FIG. 18 is a graph 1800 tracking performance of a fractional-N charge-pump PLL without a DTC. FIG. 19 is a graph 1900 tracking performance of a fractional-N charge-pump PLL with a DTC, according to an embodiment.

As shown in graph 1800 by the charge-pump current output waveform 1802, the charge-pump output current carries the quantization noise 1804 generated by the divider and ΣΔ-modulator. As shown in graph 1900 by the charge-pump current output waveform 1902, the DTC output waveform 1904, and the feedback clock CLKFB waveform 1906, with a DTC, the rising edges 1908 of the DTC output are aligned to the CLKFB rising edges 1910. The charge-pump output does not contain the quantization noise from the divider and ΣΔ-modulator because the noise is cancelled out by the DTC. For the DTC to cancel out the quantization noise from the divider and ΣΔ-modulator, DTC gain calibration is utilized, such as the DTC gain calibration for a sampling fractional-N PLL or a sub-sampling fractional-N PLL described above.

Figure 20:
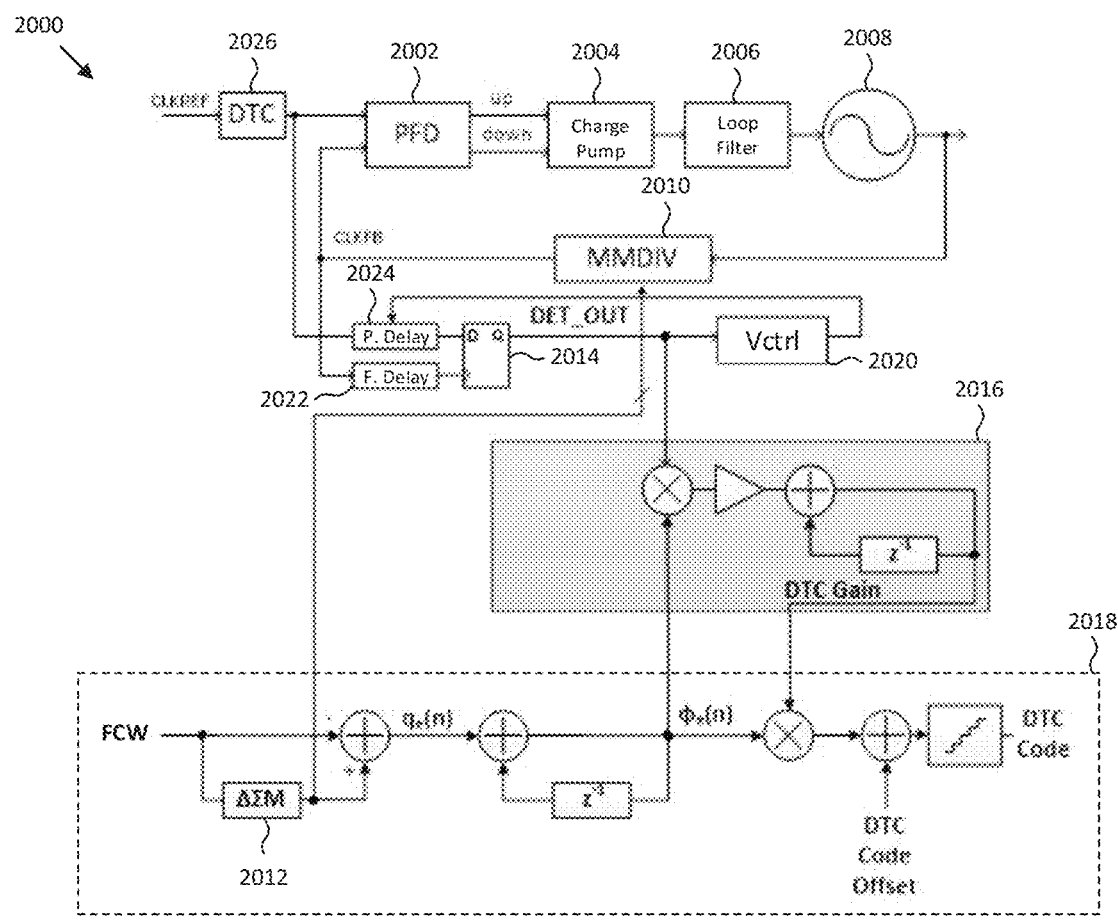
FIG. 20 is a diagram of a charge-pump delta-sigma fractional-N PLL, according to an embodiment.

FIG. 20 is a diagram of a charge-pump delta-sigma fractional-N PLL 2000, according to an embodiment. The PLL 2000 includes a PFD 2002, a charge-pump 2004, a loop filter 2006, a VCO 2008, an MMDIV 2010, a ΣΔ-modulator 2012, a flip-flop 2014, a DTC gain calibration circuit 2016, a DTC code generation circuit 2018, a voltage generation circuit 2020, a fixed delay circuit 2022, a programmable delay circuit 2024, and a DTC 2026.

The PLL 2000 utilizes the DTC 2026 and the DTC gain calibration circuit 2016 to cancel the quantization noise from the ΣΔ-modulator 2012 and the MMDIV 2010. A flip-flop 2014 is utilized to compare the relative rising edge timing of the reference clock CLKREF (e.g., a reference voltage) delayed by the DTC 2026 and the feedback clock CLKFB. Convergence of the DTC gain calibration requires compensating for the difference between the output of the PFD 2002 and the charge-pump 2004 and the output of the flip-flop 2014, a fixed delay circuit (F. Delay) 2022 is added to the feedback clock CLKFB and a programmable delay circuit (P. Delay) 2024 is added to the DTC 2026 output.

The flip-flop 2014 output (DET_OUT) may be mapped to values of +1/−1 to drive the DTC gain calibration circuit 2016 and the programmable delay circuit 2024. For example, if the low-pass filtered flip-flop 2014 output is greater than or equal to 0, the delay generated by the programmable delay circuit 2024 may need to be increased. If the low-pass filtered flip-flop 2014 output is less than 0, the delay generated by the programmable delay circuit 2024 may need to be decreased.

Figure 21:
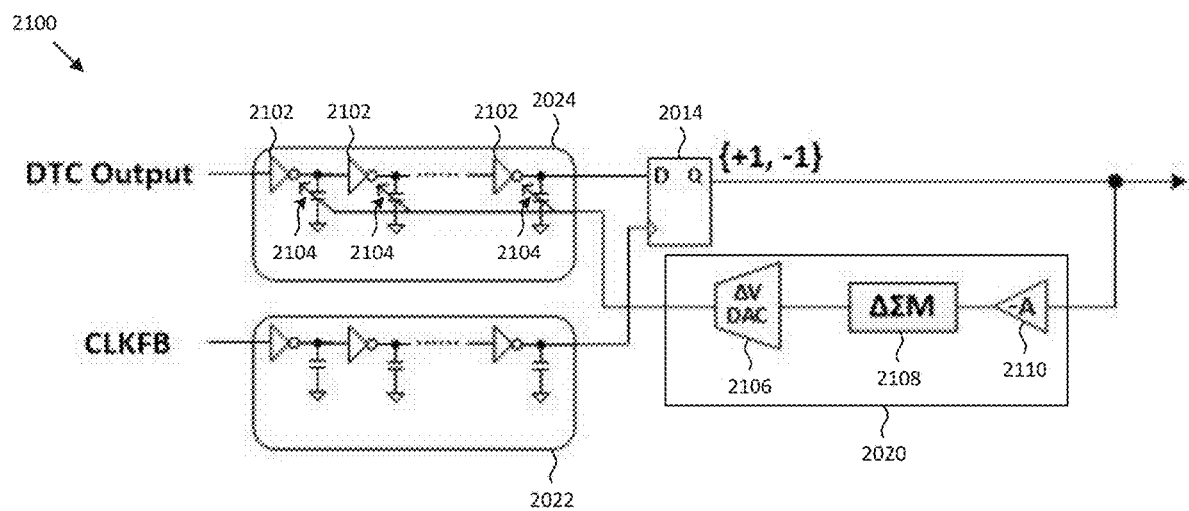
FIG. 21 is a diagram of circuits in a charge-pump delta-sigma fractional-N PLL, according to an embodiment.

FIG. 21 is a diagram 2100 of circuits in a charge-pump delta-sigma fractional-N PLL, according to an embodiment. The circuits in diagram 2100 include the flip-flop 2014, the voltage generation circuit 2020, the fixed delay circuit 2022, and the programmable delay circuit 2024. The programmable delay circuit 2024 includes a number of inverters 2102 loaded by varactors 2104. The voltage generation circuit 2020 includes a ΔV-DAC 2106, a ΣΔ-modulator 2108, and a scalar 2110. Although the voltage generation circuit 2020 is shown as similar to the voltage generation circuit 1400 described above, the voltage generation circuit 2020 is not limited to such configurations, such as the voltage generation circuits 1200 and 1300, as well as other configurations described above. Furthermore, the voltage generation circuit 2020 may be referred to a control voltage (Vctrl) generation circuit or a delay-line Vctrl generation circuit for ease of description.

The output of the flip-flop 2014 is received by the delay-line Vctrl generation circuit 2020. The flip-flop 2014 output is scaled by scalar 2110 by a factor of A, where A is a fixed positive value less than 1. The scaled output drives the ΣΔ-modulator 2108, and the one-bit output of the ΣΔ-modulator 2108 drives the ΔV-DAC 2106. The ΔV-DAC 2106 generates the control voltage Vctrl which is fed to the programmable delay circuit 2024 to control the amount of delay the programmable delay circuit 2024 applies to the DTC output. The delayed DTC output is inputted to the flip-flop 2014 as a reference voltage for the flip-flop 2014.

Figure 22:
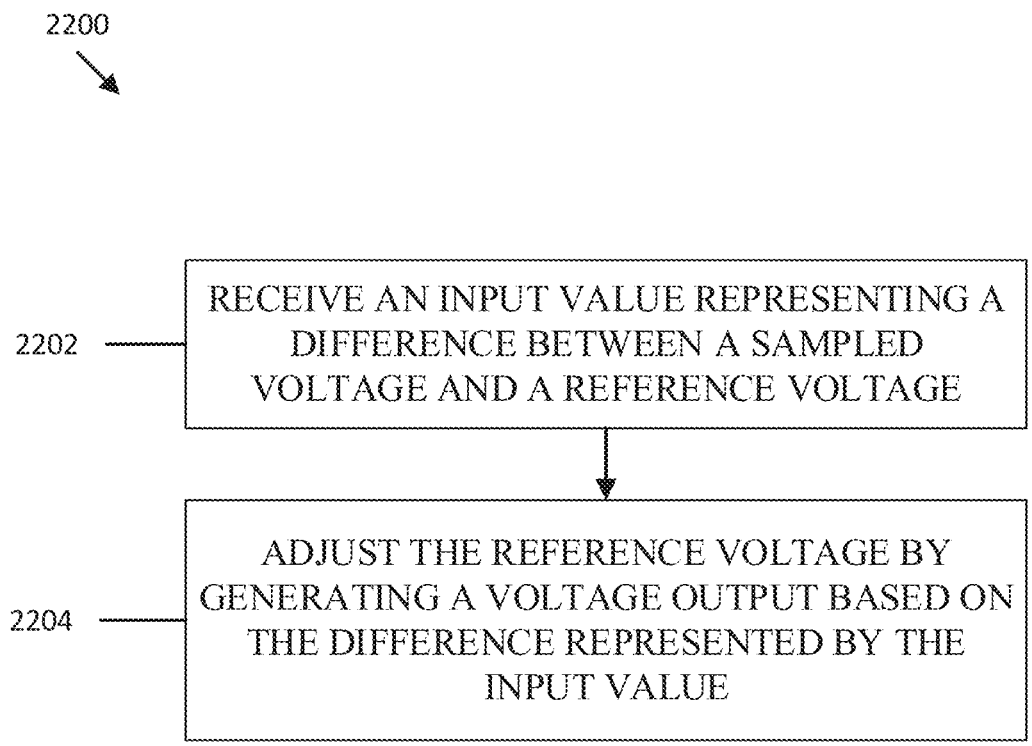
FIG. 22 is a flowchart of a method for adjusting a reference voltage in a PLL, according to an embodiment.

FIG. 22 is a flowchart 2200 of a method for adjusting a reference voltage in a PLL, according to an embodiment. At 2202, an input value representing a difference between a sampled voltage and a reference voltage is received. The input value may be received by a voltage generation circuit, such as a VREF generation circuit or a Vctrl generation circuit. In examples with analog sampling/subsampling fractional-N PLLs such as those described above, the input value may be generated by a comparator, and the input value represents a difference between a sampled voltage at a Gm circuit and a reference voltage. In examples with charge-pump PLLs such as those described above, the input value may be generated by a flip-flop and the input value represents a difference between a sampled voltage from a DTC output and a reference voltage. As described above, the input value may be a +1 or a −1 depending on whether the sampled voltage is greater than the reference voltage or whether the sampled voltage is less than the reference voltage At 2204, the reference voltage is adjusted by generating a voltage output based on the difference represented by the input value. The reference voltage may be adjusted and the voltage output may be generated by a voltage generation circuit, such as a VREF generation circuit or a Vctrl generation circuit. In examples with analog sampling/subsampling fractional-N PLLs, the voltage output may be an adjusted reference voltage that is input into a comparator to again generate an input value by comparing the adjusted reference voltage to the voltage sampled at the Gm circuit. In examples with charge-pump PLLs, the voltage output may be received by a programmable delay circuit which delays the DTC output (e.g., reference voltage). The delayed DTC output may be inputted into a flip-flop to again generate an input value representing the difference between a sampled voltage (e.g., CLKFB) and the delayed reference voltage.

The steps in flowchart 2200 may repeat until the reference voltage converges to the value of the sampled voltage. In analog sampling/subsampling fractional-N PLLs, steps 2202 and 2204 may be repeated as the adjusted reference voltage approaches the value of the Gm sampled voltage, and the method may end when the adjusted reference voltage matches the Gm sampled voltage. In charge pump PLLs, steps 2202 and 2204 may be repeated as the delayed reference voltage approaches the value of the sampled voltage, and the method may end when the delayed reference voltage matches the sampled voltage.

Figure 23:
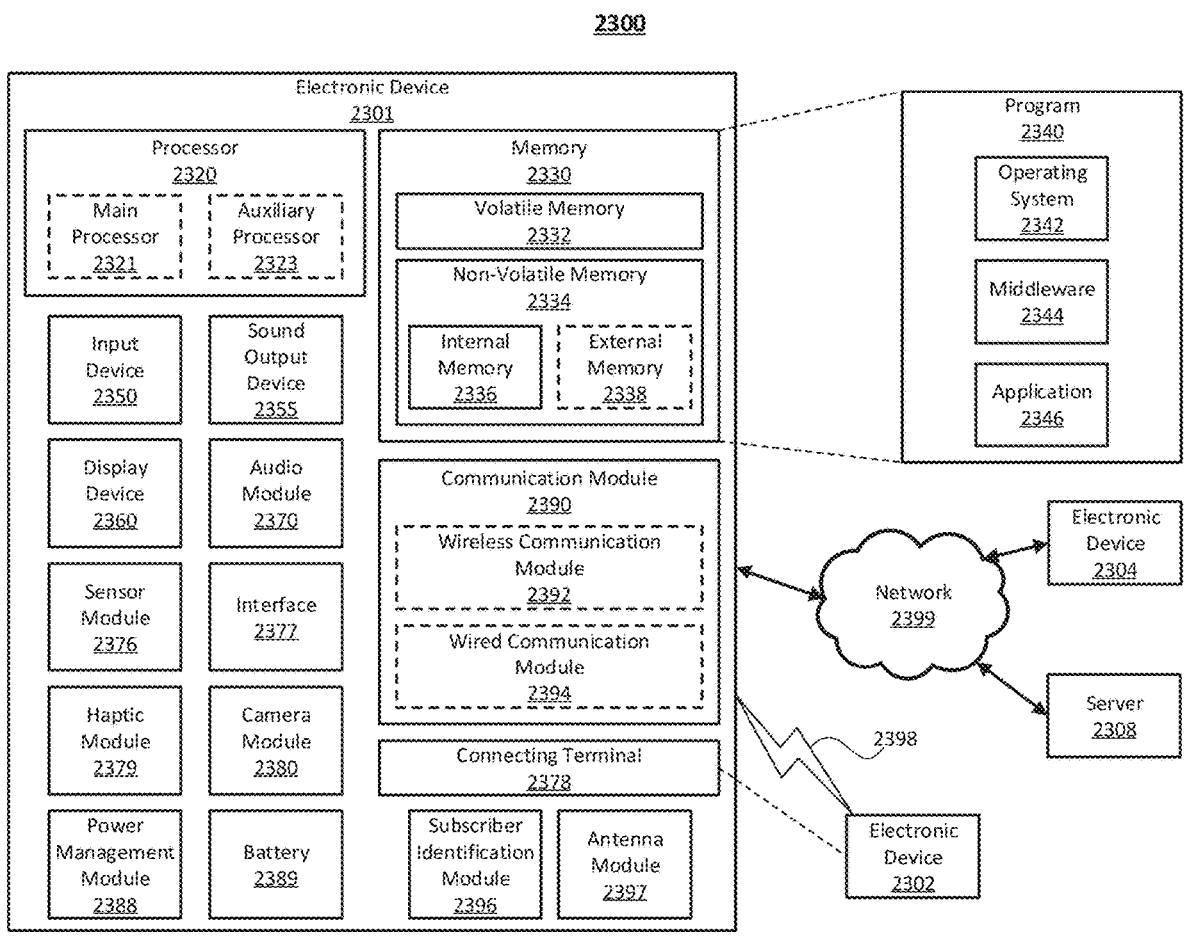
FIG. 23 is a block diagram of an electronic device in a network environment, according to one embodiment.

FIG. 23 is a block diagram of an electronic device 2301 in a network environment 2300, according to one embodiment. Referring to FIG. 23, the electronic device 2301 in the network environment 2300 may communicate with an electronic device 2302 via a first network 2398 (e.g., a short-range wireless communication network), or an electronic device 2304 or a server 2308 via a second network 2399 (e.g., a long-range wireless communication network). According to one embodiment, the electronic device 2301 may communicate with the electronic device 2304 via the server 2308. The electronic device 2301 may include a processor 2320, a memory 2330, an input device 2350, a sound output device 2355, a display device 2360, an audio module 2370, a sensor module 2376, an interface 2377, a haptic module 2379, a camera module 2380, a power management module 2388, a battery 2389, a communication module 2390, a subscriber identification module (SIM) 2396, or an antenna module 2397. In one embodiment, at least one (e.g., the display device 2360 or the camera module 2380) of the components may be omitted from the electronic device 2301, or one or more other components may be added to the electronic device 2301. In one embodiment, some of the components may be implemented as a single integrated circuit (IC). For example, the sensor module 2376 (e.g., a fingerprint sensor, an iris sensor, or an illuminance sensor) may be embedded in the display device 2360 (e.g., a display).

The processor 2320 may execute, for example, software (e.g., a program 2340) to control at least one other component (e.g., a hardware or a software component) of the electronic device 2301 coupled with the processor 2320, and may perform various data processing or computations. According to one embodiment, as at least part of the data processing or computations, the processor 2320 may load a command or data received from another component (e.g., the sensor module 2376 or the communication module 2390) in volatile memory 2332, process the command or the data stored in the volatile memory 2332, and store resulting data in non-volatile memory 2334. According to one embodiment, the processor 2320 may include a main processor 2321 (e.g., a central processing unit (CPU) or an application processor (AP)), and an auxiliary processor 2323 (e.g., a graphics processing unit (GPU), an image signal processor (ISP), a sensor hub processor, or a communication processor (CP)) that is operable independently from, or in conjunction with, the main processor 2321. Additionally or alternatively, the auxiliary processor 2323 may be adapted to consume less power than the main processor 2321, or execute a particular function. The auxiliary processor 2323 may be implemented as being separate from, or a part of, the main processor 2321.

The auxiliary processor 2323 may control at least some of the functions or states related to at least one component (e.g., the display device 2360, the sensor module 2376, or the communication module 2390) among the components of the electronic device 2301, instead of the main processor 2321 while the main processor 2321 is in an inactive (e.g., sleep) state, or together with the main processor 2321 while the main processor 2321 is in an active state (e.g., executing an application). According to one embodiment, the auxiliary processor 2323 (e.g., an image signal processor or a communication processor) may be implemented as part of another component (e.g., the camera module 2380 or the communication module 2390) functionally related to the auxiliary processor 2323.

The memory 2330 may store various data used by at least one component (e.g., the processor 2320 or the sensor module 2376) of the electronic device 2301. The various data may include, for example, software (e.g., the program 2340) and input data or output data for a command related thererto. The memory 2330 may include the volatile memory 2332 or the non-volatile memory 2334.

The program 2340 may be stored in the memory 2330 as software, and may include, for example, an operating system (OS) 2342, middleware 2344, or an application 2346.

The input device 2350 may receive a command or data to be used by other component (e.g., the processor 2320) of the electronic device 2301, from the outside (e.g., a user) of the electronic device 2301. The input device 2350 may include, for example, a microphone, a mouse, or a keyboard.

The sound output device 2355 may output sound signals to the outside of the electronic device 2301. The sound output device 2355 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 2360 may visually provide information to the outside (e.g., a user) of the electronic device 2301. The display device 2360 may include, for example, a display, a hologram device, or a projector and control circuitry to control a corresponding one of the display, hologram device, and projector. According to one embodiment, the display device 2360 may include touch circuitry adapted to detect a touch, or sensor circuitry (e.g., a pressure sensor) adapted to measure the intensity of force incurred by the touch.

The audio module 2370 may convert a sound into an electrical signal and vice versa. According to one embodiment, the audio module 2370 may obtain the sound via the input device 2350, or output the sound via the sound output device 2355 or a headphone of an external electronic device (e.g., electronic device 2302) directly (e.g., wiredly) or wirelessly coupled with the electronic device 2301.

The sensor module 2376 may detect an operational state (e.g., power or temperature) of the electronic device 2301 or an environmental state (e.g., a state of a user) external to the electronic device 2301, and then generate an electrical signal or data value corresponding to the detected state. According to one embodiment, the sensor module 2376 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 2377 may support one or more specified protocols to be used for the electronic device 2301 to be coupled with the external electronic device (e.g., the electronic device 2302) directly (e.g., wiredly) or wirelessly. According to one embodiment, the interface 2377 may include, for example, a high definition multimedia interface (HDMI), a universal serial bus (USB) interface, a secure digital (SD) card interface, or an audio interface.

A connecting terminal 2378 may include a connector via which the electronic device 2301 may be physically connected with the external electronic device (e.g., the electronic device 2302). According to one embodiment, the connecting terminal 2378 may include, for example, an HDMI connector, a USB connector, an SD card connector, or an audio connector (e.g., a headphone connector).

The haptic module 2379 may convert an electrical signal into a mechanical stimulus (e.g., a vibration or a movement) or an electrical stimulus which may be recognized by a user via tactile sensation or kinesthetic sensation. According to one embodiment, the haptic module 2379 may include, for example, a motor, a piezoelectric element, or an electrical stimulator.

The camera module 2380 may capture a still image or moving images. According to one embodiment, the camera module 2380 may include one or more lenses, image sensors, image signal processors, or flashes.

The power management module 2388 may manage power supplied to the electronic device 2301. According to one embodiment, the power management module 2388 may be implemented as at least part of, for example, a power management integrated circuit (PMIC).

The battery 2389 may supply power to at least one component of the electronic device 2301. According to one embodiment, the battery 2389 may include, for example, a primary cell which is not rechargeable, a secondary cell which is rechargeable, or a fuel cell.

The communication module 2390 may support establishing a direct (e.g., wired) communication channel or a wireless communication channel between the electronic device 2301 and the external electronic device (e.g., the electronic device 2302, the electronic device 2304, or the server 2308) and performing communication via the established communication channel. The communication module 2390 may include one or more communication processors that are operable independently from the processor 2320 (e.g., the AP) and supports a direct (e.g., wired) communication or a wireless communication. According to one embodiment, the communication module 2390 may include a wireless communication module 2392 (e.g., a cellular communication module, a short-range wireless communication module, or a global navigation satellite system (GNSS) communication module) or a wired communication module 2394 (e.g., a local area network (LAN) communication module or a power line communication (PLC) module). A corresponding one of these communication modules may communicate with the external electronic device via the first network 2398 (e.g., a short-range communication network, such as Bluetooth™, wireless-fidelity (Wi-Fi) direct, or a standard of the Infrared Data Association (IrDA)) or the second network 2399 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 2392 may identify and authenticate the electronic device 2301 in a communication network, such as the first network 2398 or the second network 2399, using subscriber information (e.g., international mobile subscriber identity (IMSI)) stored in the subscriber identification module 2396.

The antenna module 2397 may transmit or receive a signal or power to or from the outside (e.g., the external electronic device) of the electronic device 2301. According to one embodiment, the antenna module 2397 may include one or more antennas, and, therefrom, at least one antenna appropriate for a communication scheme used in the communication network, such as the first network 2398 or the second network 2399, may be selected, for example, by the communication module 2390 (e.g., the wireless communication module 2392). The signal or the power may then be transmitted or received between the communication module 2390 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 2301 and the external electronic device 2304 via the server 2308 coupled with the second network 2399. Each of the electronic devices 2302 and 2304 may be a device of a same type as, or a different type, from the electronic device 2301. According to one embodiment, all or some of operations to be executed at the electronic device 2301 may be executed at one or more of the external electronic devices 2302, 2304, or 2308. For example, if the electronic device 2301 should perform a function or a service automatically, or in response to a request from a user or another device, the electronic device 2301, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 2301. The electronic device 2301 may provide the outcome, with or without further processing of the outcome, as at least part of a reply to the request. To that end, a cloud computing, distributed computing, or client-server computing technology may be used, for example.

One embodiment may be implemented as software (e.g., the program 2340) including one or more instructions that are stored in a storage medium (e.g., internal memory 2336 or external memory 2338) that is readable by a machine (e.g., the electronic device 2301). For example, a processor (e.g., the processor 2320) of the machine (e.g., the electronic device 2301) may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. According to one embodiment, one or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 24:
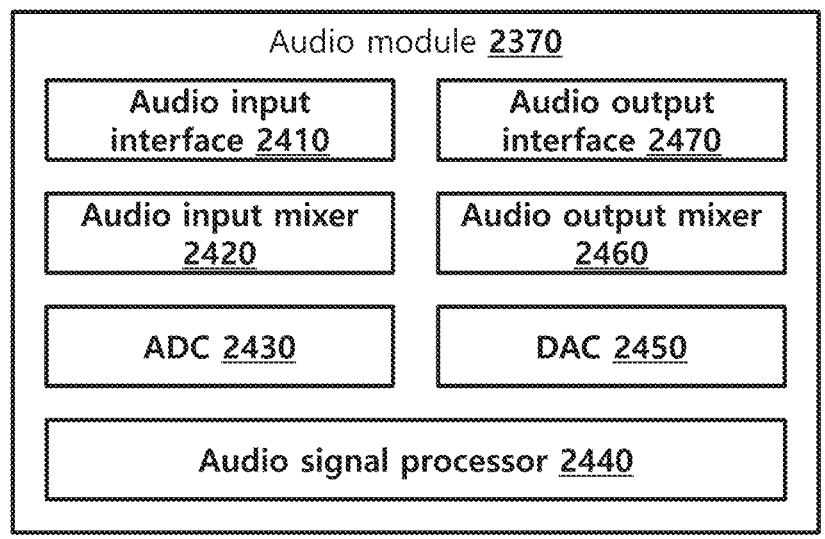
FIG. 24 is a block diagram of an audio module, according to one embodiment.

FIG. 24 is a block diagram of the audio module 2370, according to one embodiment. Referring to FIG. 24, the audio module 2370 may include, for example, an audio input interface 2410, an audio input mixer 2420, an analog-to-digital converter (ADC) 2430, an audio signal processor 2440, a digital-to-analog converter (DAC) 2450, an audio output mixer 2460, or an audio output interface 2470.

The audio input interface 2410 may receive an audio signal corresponding to a sound obtained from the outside of the electronic device 2301 via a microphone (e.g., a dynamic microphone, a condenser microphone, or a piezo microphone) that is configured as part of the input device 2350 or separately from the electronic device 2301. For example, if an audio signal is obtained from the external electronic device 2302 (e.g., a headset or a microphone), the audio input interface 2410 may be connected with the external electronic device 2302 directly via the connecting terminal 2378, or wirelessly (e.g., Bluetooth™ communication) via the wireless communication module 2392 to receive the audio signal. According to one embodiment, the audio input interface 2410 may receive a control signal (e.g., a volume adjustment signal received via an input button) related to the audio signal obtained from the external electronic device 2302. The audio input interface 2410 may include a plurality of audio input channels and may receive a different audio signal via a corresponding one of the plurality of audio input channels, respectively. According to one embodiment, additionally or alternatively, the audio input interface 2410 may receive an audio signal from another component (e.g., the processor 2320 or the memory 2330) of the electronic device 2301.

The audio input mixer 2420 may synthesize a plurality of inputted audio signals into at least one audio signal. For example, according to one embodiment, the audio input mixer 2420 may synthesize a plurality of analog audio signals inputted via the audio input interface 2410 into at least one analog audio signal.

The ADC 2430 may convert an analog audio signal into a digital audio signal. For example, according to one embodiment, the ADC 2430 may convert an analog audio signal received via the audio input interface 2410 or, additionally or alternatively, an analog audio signal synthesized via the audio input mixer 2420 into a digital audio signal.

The audio signal processor 2440 may perform various processing on a digital audio signal received via the ADC 2430 or a digital audio signal received from another component of the electronic device 2301. For example, according to one embodiment, the audio signal processor 2440 may perform changing a sampling rate, applying one or more filters, interpolation processing, amplifying or attenuating a whole or partial frequency bandwidth, noise processing (e.g., attenuating noise or echoes), changing channels (e.g., switching between mono and stereo), mixing, or extracting a specified signal for one or more digital audio signals. According to one embodiment, one or more functions of the audio signal processor 2340 may be implemented in the form of an equalizer.

The DAC 2450 may convert a digital audio signal into an analog audio signal. For example, according to one embodiment, the DAC 2450 may convert a digital audio signal processed by the audio signal processor 2440 or a digital audio signal obtained from another component (e.g., the processor 2320 or the memory 2330) of the electronic device 2301 into an analog audio signal.

The audio output mixer 2460 may synthesize a plurality of audio signals, which are to be outputted, into at least one audio signal. For example, according to one embodiment, the audio output mixer 2460 may synthesize an analog audio signal converted by the DAC 2450 and another analog audio signal (e.g., an analog audio signal received via the audio input interface 2410) into at least one analog audio signal.

The audio output interface 2470 may output an analog audio signal converted by the DAC 2450 or, additionally or alternatively, an analog audio signal synthesized by the audio output mixer 2460 to the outside of the electronic device 2301 via the sound output device 2355. The sound output device 2355 may include, for example, a speaker, such as a dynamic driver or a balanced armature driver, or a receiver. According to one embodiment, the sound output device 2355 may include a plurality of speakers. In such a case, the audio output interface 2470 may output audio signals having a plurality of different channels (e.g., stereo channels or 5.1 channels) via at least some of the plurality of speakers. According to one embodiment, the audio output interface 2470 may be connected with the external electronic device 2302 (e.g., an external speaker or a headset) directly via the connecting terminal 2378 or wirelessly via the wireless communication module 2392 to output an audio signal.

According to one embodiment, the audio module 2370 may generate, without separately including the audio input mixer 2420 or the audio output mixer 2460, at least one digital audio signal by synthesizing a plurality of digital audio signals using at least one function of the audio signal processor 2440.

According to one embodiment, the audio module 2370 may include an audio amplifier (e.g., a speaker amplifying circuit) that is capable of amplifying an analog audio signal inputted via the audio input interface 2410 or an audio signal that is to be outputted via the audio output interface 2470. According to one embodiment, the audio amplifier may be configured as a module separate from the audio module 2370.

Figure 25:
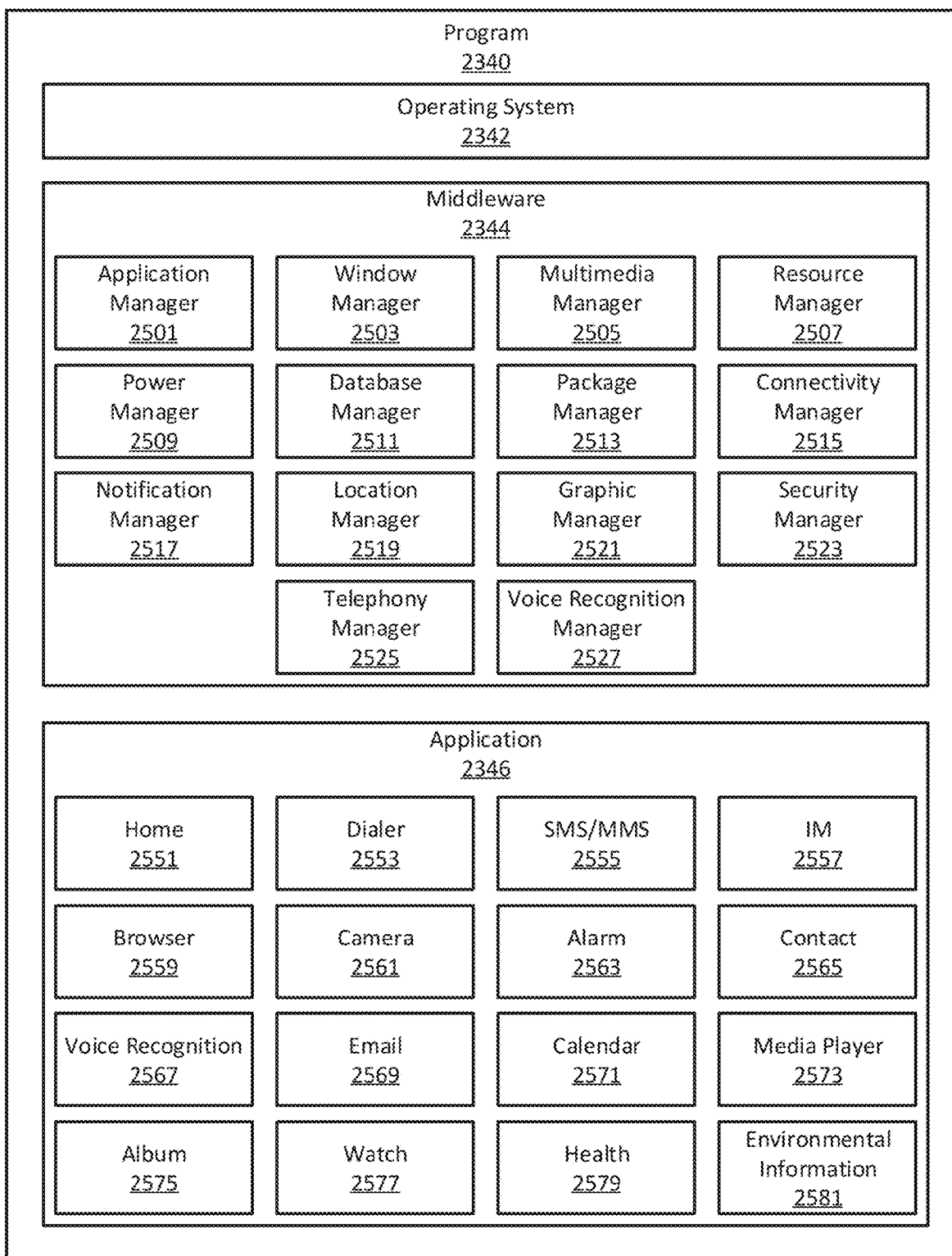
FIG. 25 is a block diagram of a program, according to one embodiment.

FIG. 25 is a block diagram of the program 2340 according to one embodiment. Referring to FIG. 25, the program 2340 may include an OS 2342 to control one or more resources of the electronic device 2301, middleware 2344, or an application 2346 executable in the OS 2342. The OS 2342 may include, for example, Android®, iOS®, Windows®, Symbian®, Tizen®, or Bada™. At least part of the program 2340, for example, may be pre-loaded on the electronic device 2301 during manufacture, or may be downloaded from or updated by an external electronic device (e.g., the electronic device 2302 or 2304, or the server 2308) during use by a user.

The OS 2342 may control management (e.g., allocating or deallocation) of one or more system resources (e.g., process, memory, or power source) of the electronic device 2301. The OS 2342, additionally or alternatively, may include one or more driver programs to drive other hardware devices of the electronic device 2301, for example, the input device 2350, the sound output device 2355, the display device 2360, the audio module 2370, the sensor module 2376, the interface 2377, the haptic module 2379, the camera module 2380, the power management module 2388, the battery 2389, the communication module 2390, the subscriber identification module 2396, or the antenna module 2397.

The middleware 2344 may provide various functions to the application 2346 such that a function or information provided from one or more resources of the electronic device 2301 may be used by the application 2346. The middleware 2344 may include, for example, an application manager 2501, a window manager 2503, a multimedia manager 2505, a resource manager 2507, a power manager 2509, a database manager 2511, a package manager 2513, a connectivity manager 2515, a notification manager 2517, a location manager 2519, a graphic manager 2521, a security manager 2523, a telephony manager 2525, or a voice recognition manager 2527.

The application manager 2501, for example, may manage the life cycle of the application 2346. The window manager 2503, for example, may manage one or more graphical user interface (GUI) resources that are used on a screen. The multimedia manager 2505, for example, may identify one or more formats to be used to play media files, and may encode or decode a corresponding one of the media files using a codec appropriate for a corresponding format selected from the one or more formats. The resource manager 2507, for example, may manage the source code of the application 2346 or a memory space of the memory 2330. The power manager 2509, for example, may manage the capacity, temperature, or power of the battery 2389, and determine or provide related information to be used for the operation of the electronic device 2301 based at least in part on corresponding information of the capacity, temperature, or power of the battery 2389. According to one embodiment, the power manager 2509 may interoperate with a basic input/output system (BIOS) of the electronic device 2301.

The database manager 2511, for example, may generate, search, or change a database to be used by the application 2346. The package manager 2513, for example, may manage installation or update of an application that is distributed in the form of a package file. The connectivity manager 2515, for example, may manage a wireless connection or a direct connection between the electronic device 2301 and the external electronic device. The notification manager 2517, for example, may provide a function to notify a user of an occurrence of a specified event (e.g., an incoming call, message, or alert). The location manager 2519, for example, may manage locational information on the electronic device 2301. The graphic manager 2521, for example, may manage one or more graphic effects to be offered to a user or a user interface related to the one or more graphic effects.

The security manager 2523, for example, may provide system security or user authentication. The telephony manager 2525, for example, may manage a voice call function or a video call function provided by the electronic device 2301. The voice recognition manager 2527, for example, may transmit a user's voice data to the server 2308, and receive, from the server 2308, a command corresponding to a function to be executed on the electronic device 2301 based at least in part on the voice data, or text data converted based at least in part on the voice data. According to one embodiment, the middleware 2344 may dynamically delete some existing components or add new components. According to one embodiment, at least part of the middleware 2344 may be included as part of the OS 2342 or may be implemented in other software separate from the OS 2342.

The application 2346 may include, for example, a home application 2551, a dialer application 2553, a short message service (SMS)/multimedia messaging service (MMS) application 2555, an instant message (IM) application 2557, a browser application 2559, a camera application 2561, an alarm application 2563, a contact application 2565, a voice recognition application 2567, an email application 2569, a calendar application 2571, a media player application 2573, an album application 2575, a watch application 2577, a health application 2579 (e.g., for measuring the degree of workout or biometric information, such as blood sugar), or an environmental information application 2581 (e.g., for measuring air pressure, humidity, or temperature information). According to one embodiment, the application 2346 may further include an information exchanging application that is capable of supporting information exchange between the electronic device 2301 and the external electronic device. The information exchange application, for example, may include a notification relay application adapted to transfer designated information (e.g., a call, a message, or an alert) to the external electronic device or a device management application adapted to manage the external electronic device. The notification relay application may transfer notification information corresponding to an occurrence of a specified event (e.g., receipt of an email) at another application (e.g., the email application 2569) of the electronic device 2301 to the external electronic device. Additionally or alternatively, the notification relay application may receive notification information from the external electronic device and provide the notification information to a user of the electronic device 2301.

The device management application may control the power (e.g., turn-on or turn-off) or the function (e.g., adjustment of brightness, resolution, or focus) of the external electronic device or some component thereof (e.g., a display device or a camera module of the external electronic device). The device management application, additionally or alternatively, may support installation, delete, or update of an application running on the external electronic device.

Figure 26:
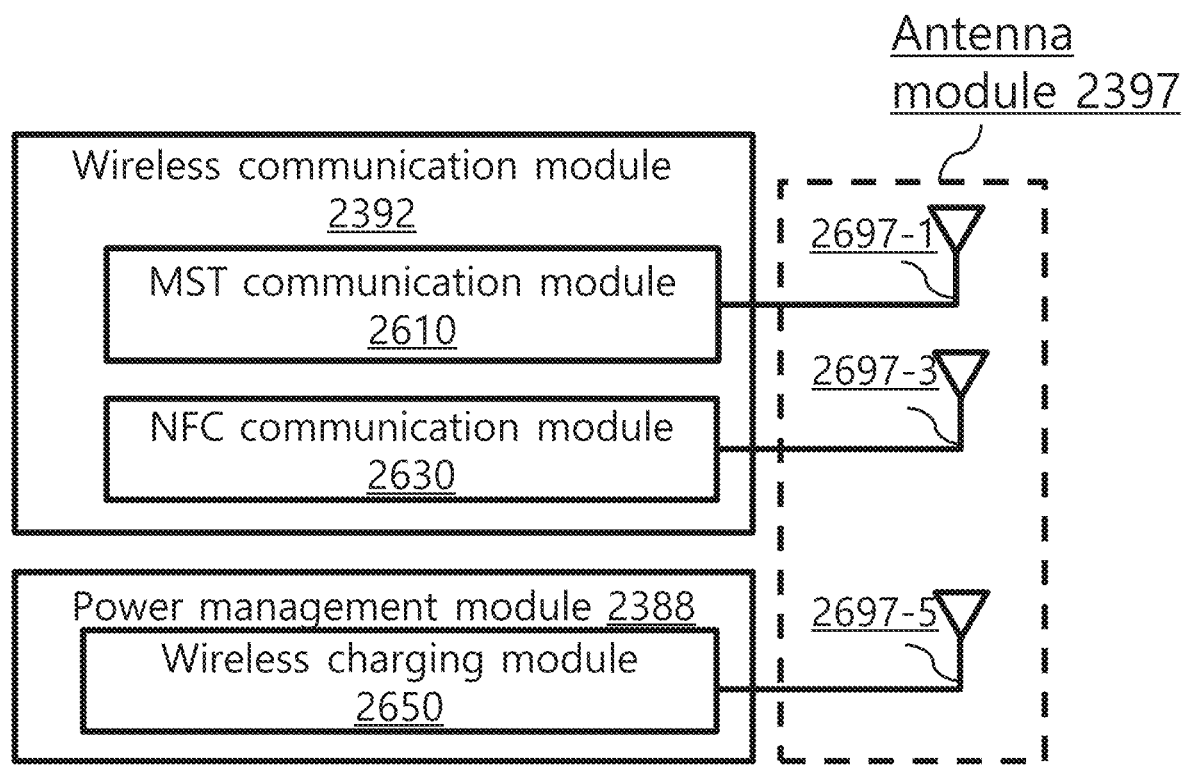
FIG. 26 is a block diagram of a wireless communication module, a power management module, and an antenna module of an electronic device, according to one embodiment.

FIG. 26 is a block diagram of the wireless communication module 2392, the power management module 2388, and the antenna module 2397 of the electronic device 2301, according to one embodiment. Referring to FIG. 26, the wireless communication module 2392 may include a magnetic secure transmission (MST) communication module 2610 or a near-field communication (NFC) module 2630, and the power management module 2388 may include a wireless charging module 2650. In this case, the antenna module 2397 may include a plurality of antennas that include an MST antenna 2697-1 connected with the MST communication module 2610, an NFC antenna 2697-3 connected with the NFC communication module 2630, and a wireless charging antenna 2697-5 connected with the wireless charging module 2650. Descriptions of components described above with regard to FIG. 23 are either briefly described or omitted here.

The MST communication module 2610 may receive a signal containing control information or payment information such as card (e.g., credit card) information from the processor 2320, generate a magnetic signal corresponding to the received signal, and then transfer the generated magnetic signal to the external electronic device 2302 (e.g., a point-of-sale (POS) device) via the MST antenna 2697-1. To generate the magnetic signal, according to one embodiment, the MST communication module 2610 may include a switching module that includes one or more switches connected with the MST antenna 2697-1, and control the switching module to change the direction of voltage or current supplied to the MST antenna 2697-1 according to the received signal. The change of the direction of the voltage or current allows the direction of the magnetic signal (e.g., a magnetic field) emitted from the MST antenna 2697-1 to change accordingly. If detected at the external electronic device 2302, the magnetic signal with its direction changing may cause an effect (e.g., a waveform) similar to that of a magnetic field that is generated when a magnetic card corresponding to the card information associated with the received signal is swiped through a card reader of the electronic device 2302. According to one embodiment, for example, payment-related information and a control signal that are received by the electronic device 2302 in the form of the magnetic signal may be further transmitted to an external server 2308 (e.g., a payment server) via the network 2399.

The NFC communication module 2630 may obtain a signal containing control information or payment information such as card information from the processor 2320 and transmit the obtained signal to the external electronic device 2302 via the NFC antenna 2697-3. According to one embodiment, the NFC communication module 2630 may receive such a signal transmitted from the external electronic device 2302 via the NFC antenna 2697-3.

The wireless charging module 2650 may wirelessly transmit power to the external electronic device 2302 (e.g., a cellular phone or wearable device) via the wireless charging antenna 2697-5, or wirelessly receive power from the external electronic device 2302 (e.g., a wireless charging device). The wireless charging module 2650 may support one or more of various wireless charging schemes including, for example, a magnetic resonance scheme or a magnetic induction scheme.

According to one embodiment, some of the MST antenna 2697-1, the NFC antenna 2697-3, or the wireless charging antenna 2697-5 may share at least part of their radiators. For example, the radiator of the MST antenna 2697-1 may be used as the radiator of the NFC antenna 2697-3 or the wireless charging antenna 2697-5, or vice versa. In this case, the antenna module 2397 may include a switching circuit adapted to selectively connect (e.g., close) or disconnect (e.g., open) at least part of the antennas 2697-1, 2697-3, and 2697-5, for example, under control of the wireless communication module 2392 (e.g., the MST communication module 2610 or the NFC communication module 2630) or the power management module (e.g., the wireless charging module 2650). For example, when the electronic device 2301 uses a wireless charging function, the NFC communication module 2630 or the wireless charging module 2650 may control the switching circuit to temporarily disconnect at least one portion of the radiators shared by the NFC antenna 2697-3 and the wireless charging antenna 2697-5 from the NFC antenna 2697-3 and to connect the at least one portion of the radiators with the wireless charging antenna 2697-5.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. A method, comprising:
   receiving, by a voltage generation circuit, only an input value from a comparator; and
   adjusting, by the voltage generation circuit, a voltage output that is input to the comparator based only on a difference between a sampled voltage and the voltage output represented by the input value.

2. The method of claim 1, wherein the adjusting is performed until the voltage output converges to the sampled voltage.

3. The method of claim 1, further comprising inputting, at a comparator, the voltage output from the voltage generation circuit as a reference voltage.

4. The method of claim 3, further comprising outputting, by the comparator, an output value representing a difference between the sampled voltage and the adjusted voltage output.

5. The method of claim 1, wherein the adjusting further comprises incrementing a value of the reference voltage by a predefined step value according to the difference between the sampled voltage and the voltage output.

6. The method of claim 5, further comprising changing, by the voltage generation circuit, the predefined step value based on a number of consecutive repeated input values.

7. The method of claim 1, further comprising:
delaying, by a delay circuit, the voltage output based on the voltage output received at the delay circuit from the voltage generation circuit.

8. The method of claim 7, further comprising inputting, at a flip-flop, the delayed voltage output from the delay circuit.

9. The method of claim 8, further comprising outputting, by the flip-flop, an output value representing a difference between the sampled voltage and the delayed voltage output.

10. The method of claim 1, wherein the adjusting is performed with a $\Delta$V-digital-to-analog converter ($\Delta$V-DAC) of the voltage generation circuit.

11. An electronic circuit, comprising:
a voltage generation circuit configured to:
receive only an input value from a comparator; and
adjust a voltage output that is input to the comparator based only on a difference between a sampled voltage and the voltage output represented by the input value.

12. The electronic circuit of claim 11, wherein the voltage generation circuit adjusts the voltage output until the voltage output converges to the sampled voltage.

13. The electronic circuit of claim 11, further comprising a comparator configured to generate the input value representing the difference between the sampled voltage and the voltage output, wherein the voltage output from the voltage generation circuit is input to the comparator as a reference voltage.

14. The electronic circuit of claim 13, wherein the comparator is further configured to output an output value representing a difference between the sampled voltage and the adjusted voltage output.

15. The electronic circuit of claim 11, wherein the voltage generation circuit is further configured to increment a value of the voltage output by a predefined step value according to the difference represented by the input value.

16. The electronic circuit of claim 15, wherein the voltage generation circuit is further configured to change the predefined step value based on a number of consecutive repeated input values.

17. The electronic circuit of claim 11, further comprising a delay circuit, the delay circuit configured to delay the voltage output based on the received input value.

18. The electronic circuit of claim 17, further comprising a flip-flop configured to receive the delayed voltage output from the delay circuit.

19. The electronic circuit of claim 18, wherein the flip-flop is further configured to output an output value representing a difference between the sampled voltage and the delayed voltage output.

20. The electronic circuit of claim 11, wherein the voltage generation circuit further includes a $\Delta$V-digital-to-analog converter ($\Delta$V-DAC) configured to perform the adjusting of the reference voltage.

21. The method of claim 1, wherein the sampled voltage is sampled at an input of a voltage-to-current (Gm) circuit in a phase-locked loop (PLL).

22. The method of claim 1, wherein the sampled voltage is sampled from a charge-pump PLL.

23. The electronic circuit of claim 11, wherein the sampled voltage is sampled at an input of a voltage-to-current (Gm) circuit in a phase-locked loop (PLL).

24. The electronic circuit of claim 11, wherein the sampled voltage is sampled from a charge-pump PLL.

* * * * *